United States Patent [19]
Gourab et al.

[11] Patent Number: 5,608,595
[45] Date of Patent: Mar. 4, 1997

[54] SEMICONDUCTOR POWER MODULE AND POWER CONVERSION DEVICE

[75] Inventors: Majumdar Gourab; Takahiro Hiramoto, both of Fukuoka; Takeshi Tanaka, Hyogo, all of Japan

[73] Assignee: Mitsubishi Denki Kabushiki Kaisha, Tokyo, Japan

[21] Appl. No.: 423,981

[22] Filed: Apr. 18, 1995

[30] Foreign Application Priority Data

Apr. 28, 1994 [JP] Japan .................................. 6-092039

[51] Int. Cl.$^6$ ........................................................ H02H 3/18
[52] U.S. Cl. .............................. 361/79; 361/30; 361/88; 361/101
[58] Field of Search ................................. 361/79, 18, 30, 361/86–89, 91, 93–94, 98, 100–101, 55–56; 257/355–357, 360–363

[56] References Cited

U.S. PATENT DOCUMENTS

| | | | |
|---|---|---|---|
| 4,750,079 | 6/1988 | Fay et al. | 361/101 |
| 5,079,608 | 1/1992 | Wodarczyk et al. | 361/101 |
| 5,119,265 | 6/1992 | Qualich et al. | 361/103 |
| 5,138,516 | 8/1992 | Chapman | 361/18 |
| 5,281,872 | 1/1994 | Mori . | |
| 5,304,935 | 4/1994 | Rathke et al. | 324/415 |

FOREIGN PATENT DOCUMENTS

A0561386 9/1993 European Pat. Off. .

OTHER PUBLICATIONS

Revue Generale De L'Electricite, No. 2, 1 Feb. 1994, pp. 8–12, XP00042647 Lorenz L: "Drive And Protection Concepts For IGBTS".
IEEE Transactions On Power Electronics, vol. 6, No. 4, 1 Oct. 1991, pp. 576–584, XP00024887 Thiyagarajah K et al: "A High Switching Frequency IGBT PWM Rectifier/Inverter System For AC Motor Drives Operating From Single Phase Supply".

*Primary Examiner*—Jeffrey A. Gaffin
*Assistant Examiner*—Michael J. Sherry
*Attorney, Agent, or Firm*—Oblon, Spivak, McClelland, Maier & Neustadt, P.C.

[57] ABSTRACT

A semiconductor power module which provides reliable overvoltage protection including an overvoltage protection device which functions so that when an overcurrent flows to an IGBT (1), a sink transistor (10) turns on and the IGBT (1) turns off accordingly. As the IGBT (1) turns off to cut off the overcurrent, a high surge voltage is applied to the IGBT (1). At this time, however, a clamp current flows trough a clamping circuit including a Zener diode (6), a diode (7) and a resistance (8) and part of it is divided to a transistor (Q11), so that a transistor (Q12) turns on and the sink transistor (10) turns off as the result. Accordingly, the clamp current increases a gate voltage of the IGBT (1). Hence, large part of the load current flows in the IGBT (1), and only a little flows to the clamping circuit. Accordingly, overheat of and damage by burning to the clamping circuit will not be caused even if both the overcurrent and overvoltage are applied.

22 Claims, 17 Drawing Sheets

FIG. 16
PRIOR ART

| MODULE | MODE 1 | MODE 2 | MODE 3 |
|--------|--------|--------|--------|
| 22 | ON | OFF | OFF |
| 23 | ON | ON | OFF |
| 24 | OFF | ON | ON |
| 25 | OFF | OFF | ON |

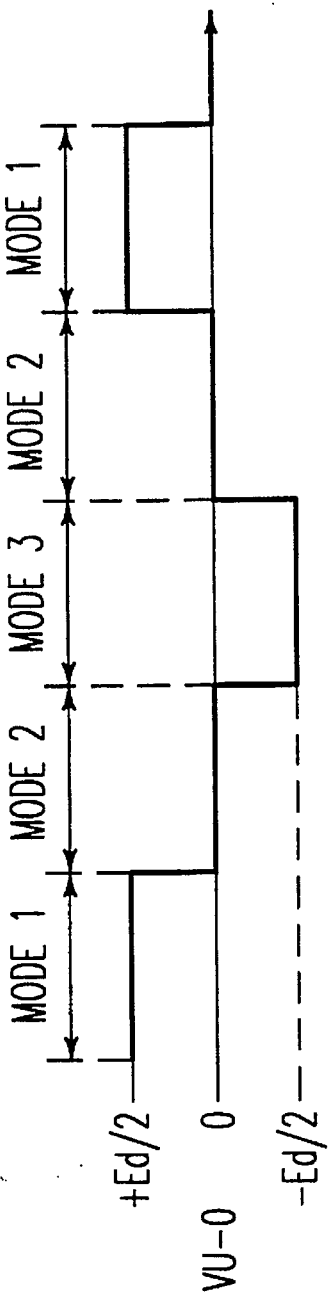
FIG. 17a PRIOR ART
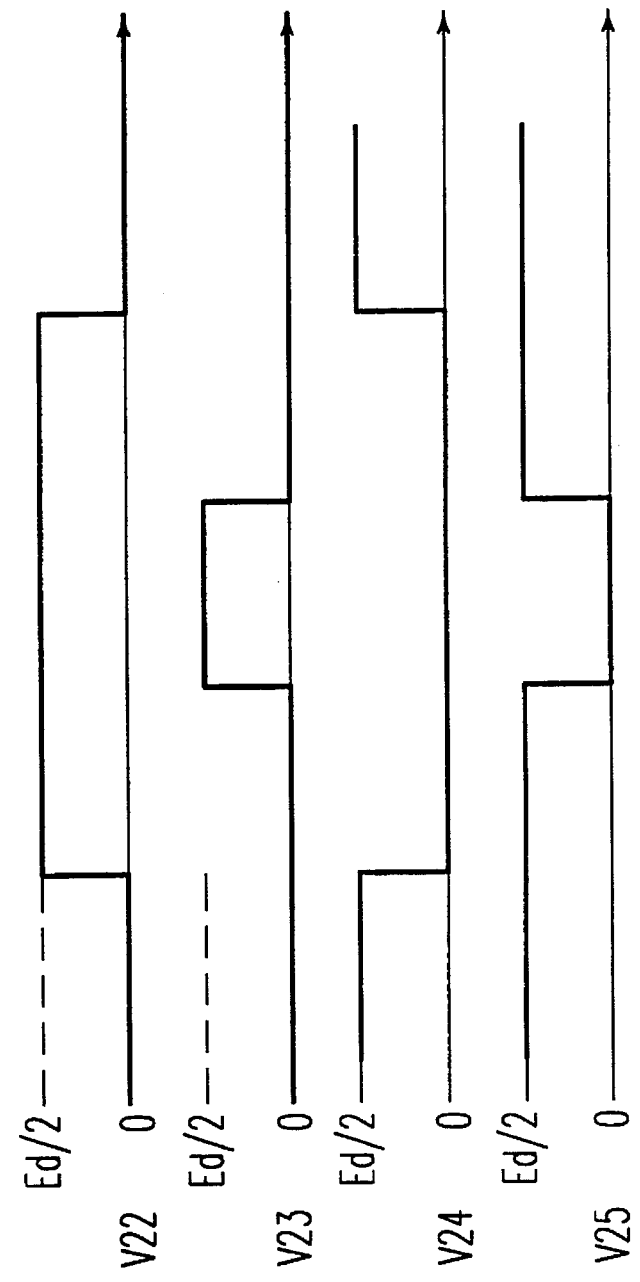
FIG. 17b PRIOR ART
FIG. 17c PRIOR ART
FIG. 17d PRIOR ART
FIG. 17e PRIOR ART

SEMICONDUCTOR POWER MODULE AND POWER CONVERSION DEVICE

BACKGROUND OF THE INVENTION

1. Field of the Invention

The present invention relates to a semiconductor power module having a switching semiconductor element and a control circuit for controlling it accommodated in the same package, and a power conversion device, such as an inverter including the semiconductor power module, and particularly to an improvement for enhancing the strength for overvoltage.

2. Description of the Background Art

A semiconductor power module has a main circuit having a switching semiconductor element, i.e., a semiconductor element for power control which performs switching operation and a control circuit having a controlling semiconductor element for controlling operation of the main circuit by exchanging signals with the main circuit incorporated in a single device. This semiconductor power module is mainly applied to an inverter for controlling operation of motors etc., or a power conversion device, such as an uninterruptible power supply.

In the semiconductor power modules, ones with high frequency which repeatedly cut off and connect power is required for a decrease in power loss, high speed response of an object of power control, such as a motor, enhancement of operational preciseness thereof, and so forth. Furthermore, the semiconductor power modules are demanded which can control larger power to be used to drive industrial large motors and the like. The insulated gate bipolar transistors (referred to as IGBT, hereinafter) are suitable for use as switching semiconductor elements in the semiconductor power modules because they have the advantages of being capable of high speed operation, being relatively easily made to have high breakdown voltage and large current capacity, and having high input resistance which facilitates voltage control.

FIG. 14 is a circuit diagram showing the circuit structure of a switching semiconductor element in a conventional semiconductor power module and the vicinity thereof. In this semiconductor power module, an IGBT 1 is used as a switching semiconductor element. The IGBT 1 is responsive to a voltage signal inputted to a gate electrode 5 to connect (ON) and cut off (OFF) a collector electrode 3 and an emitter electrode 4. Following this, the collector current (main current) intermittently flows from the collector electrode 3 to the emitter electrode 4.

A free wheel diode 2 is connected to the IGBT 1 in parallel. Further, a clamping circuit including a Zener diode 6, a diode 7 and a resistor 8 connected in series is connected between the collector electrode 3 and the gate electrode 5. The free wheel diode 2 serves to prevent the IGBT 1 from breaking down due to a reverse flow of load current when the IGBT 1 turns off from on because of the inductive load connected to the IGBT 1 in parallel. The clamping circuit serves to prevent application of excessive voltage to the IGBT 1 resulted from an abnormality occurring in the semiconductor power module itself, or in the power conversion device or the like including the semiconductor power module to protect the IGBT 1 from breakdown.

For example, in the power conversion device, an excessive voltage may be applied to the IGBT 1 if the IGBT 1 turns off when it is to turn on because an abnormal signal is inputted. Or, when the IGBT 1 is ON, if an excessive collector current flows to the IGBT 1 because of an abnormality, such as short of load, and an overcurrent protection circuit included in the semiconductor power module operates to cut off the excessive collector current, an excessive surge voltage may be generated in the IGBT 1. The clamping circuit controls such overvoltage below a certain voltage to protect the IGBT 1 from breakdown.

Conventional devices are also known which have a snubber circuit including a resistor, a diode and a capacitor instead of the clamping circuit to protect the IGBT 1 from the overvoltage.

In these conventional devices, first, in the semiconductor power module using the snubber circuit, there have been such problems as mentioned below. If the circuit constant is set supposing occurrence of an abnormality, it may unnecessarily operate for the surge voltage in normal switching operation. Or, the power loss in the snubber circuit itself can not be neglected in the normal operation, and the conversion efficiency of the power conversion device or the like decreases.

Furthermore, the semiconductor power module having the clamping circuit shown in FIG. 14 had such problems as described below.

First, the inductance component of the line connecting the semiconductor power module and the clamping circuit may delay the response of the clamping circuit, or, the surge voltage caused by the inductance component of the line may hinder sufficient protection of the IGBT included in the semiconductor power module.

Second, when the clamping circuit operate to control application of excessive voltage to the IGBT 1, the clamp current flowing in the clamping circuit may cause the clamping circuit to overheat to result in breakdown, or stable operation may not be ensured. This is especially serious in a circuit in which the IGBT 1 is turned off when the excessive collector current, or the overcurrent, flows to the IGBT 1 to prevent overheat and breakdown of the IGBT 1, i.e., in the semiconductor power module including the overcurrent protection circuit described above. That is to say, if an abnormality occurs and an overcurrent flows when the IGBT 1 is ON, an excessive surge voltage generated by the overcurrent protection circuit operating is controlled in the clamping circuit. At this time, the IGBT 1 is in the OFF state because the overcurrent protection circuit is operating, with the result that a large load current flows into the clamping circuit.

Third, in the power conversion device and the like, when an abnormality occurs accompanied by no overcurrent, such as when an excessive voltage is applied to the IGBT 1 because the IGBT 1 turns off when it is to turn on, the clamping circuit will continuously operate to cause overheat of the IGBT 1 and possibly lead the IGBT 1 to breakdown. In such a case, since the overcurrent protection circuit does not operate because there is no overcurrent, the clamp current is supplied to the gate electrode 5 when the clamping circuit operates, and the IGBT 1 is not in a perfect OFF state but it is in a half ON state. That is, with the collector voltage of the IGBT 1 (the voltage between the collector electrode 3 and the emitter electrode 4) maintained at the clamp current defined by the clamping circuit, the collector current, which should originally flow in the ON state, flows in the IGBT 1 to cause excessive power loss in the IGBT 1. This causes overheat of the IGBT 1, and further, causes breakdown of the IGBT 1.

Due to such problems, the IGBT 1 is required to have excessive breakdown voltage with respect to the rated voltage of the semiconductor power module or the power conversion device. Or, they cause a problem that the rated voltage in the semiconductor power module or the power conversion device including the IGBT 1 having a certain breakdown voltage can not be set to a sufficiently high value which corresponds to the breakdown voltage of the IGBT 1.

This is especially considerable in a three-level inverter which is a kind of power conversion device. FIG. 15 is a circuit diagram showing the circuit structure of a conventional three-level inverter. A circuit 21 for a single phase is depicted as a representative in FIG. 15. If the three-level inverter is a single-phase inverter, two of the circuits 21 are connected in parallel, and if it is a 3-phase inverter, three of the circuits 21 are connected in parallel.

In this device, as shown in FIG. 15, four stages of semiconductor power modules 22–25 are connected in series between a high potential side power-supply terminal P and a low potential side power-supply terminal N. These semiconductor power modules 22–25 include IGBTs 22a–25a and free wheel diodes 22b–25b, respectively. Direct current power-supply voltage Ed is applied between the high potential side power-supply terminal P and the low potential side power-supply terminal N from an external power source.

Two capacitors 26 and 27 having equal capacitance and connected in series are also interposed between the high potential side power-supply terminal P and the low potential side power-supply terminal N. Voltage dividing resistors (not shown) are connected in parallel to the capacitors 26 and 27 so that the potential at the connection (intermediate potential point) O thereof becomes the intermediate potential of the high potential side power-supply terminal P and the low potential side power-supply terminal N. That is to say, the capacitors 26 and 27 hold the DC voltage of Ed/2 corresponding to a half of the power-supply voltage Ed, respectively.

The connection between the two semiconductor power modules 22, 23 and the intermediate potential point O, and the connection between the two semiconductor power modules 24, 25 and the intermediate potential point O are connected through diodes 28, 27, respectively. The diode 28 is interposed so that the direction from the connection O to the semiconductor power modules 22 and 23 is its forward direction, and the other diode 27 is interposed so that the direction from the semiconductor power modules 24, 25 to the connection O is its forward direction.

This three-level inverter further includes a control device 30. This control device 30 is connected to each of the semiconductor power modules 22–25 to send input signals to each of the semiconductor power modules 22–25. In each semiconductor power module 22–25, each IGBT 22a–25a performs ON operation and OFF operation in response to these input signals.

FIG. 16 shows an operation description diagram showing operation in the normal time in this three-level inverter. FIG. 17 shows a timing chart of voltages at respective portions in the normal operation shown in FIG. 16. Shown in FIG. 17 are waveforms of a voltage VU-O of the output terminal U which is a connection of the two semiconductor power modules 23 and 24 in relation to the intermediate potential point O and collector voltages V22–V25 of the respective semiconductor power modules 22–25.

Referring to these figures, the normal operation of this three-level inverter will be described. In the normal operation, the three-level inverter sequentially repeats the three kinds of operation modes, mode 1 to mode 3. In the mode 1, the semiconductor power modules 22 and 23 turn on (ON) and other semiconductor power modules 24 and 25 turn off (OFF). Next, in the mode 2, the semiconductor power modules 23 and 24 turn on and other semiconductor power modules 22 and 25 turn off. Further, in the following mode 3, the semiconductor power modules 22 and 23 turn off and other semiconductor power modules 24 and 25 turn on.

The respective semiconductor power modules 22–25 operate in this way and the voltage VU-O becomes +Ed/2 in the mode 1, zero in the mode 2, and −Ed/2 in the mode 3. That is to say, the three-level inverter outputs voltages at three levels. In any of the modes, two of the semiconductor power modules 22–25 are turned off. Accordingly, the collector voltages V22–V25 applied to the semiconductor power modules 22–25 are always controlled to Ed/2 or below.

That is to say, since the two power modules 24 and 25 are OFF in the mode 1, the power-supply voltage Ed is divided equally to the two. As a result, the collector voltages V24 and 25 attain ED/2, respectively. In the mode 2, since the two semiconductor power modules 22 and 25 are OFF, the collector voltages V22 and V25 attain Ed/2, respectively. Further, since the two power modules 22 and 23 are OFF in the mode 3, the collector voltages V22 and V23 attain Ed/2, respectively.

As described above, as the collector voltages applied to the power modules used in the three-level inverter are always not more than ½ of the DC voltage Ed applied between the high potential side power-supply terminal P and the low potential side power-supply terminal N, it is satisfactory that each power module has the voltage blocking ability, or the breakdown voltage, being not less than ½ of the DC voltage Ed. That is to say, the three-level inverter has the advantage in being capable of handling inter-terminal voltage higher than the breakdown voltage of used power modules. Accordingly, the three-level inverter is usually used for inverters handling high voltage.

However, if a trouble of the control device 30 causes a situation out of the ON/OFF conditions in the mode 1 to mode 3, all of the power-supply voltage Ed may be applied to one of the power modules 22–25. As an example, if such an abnormality occurs in which the power modules 23–25 turn on and the remaining one semiconductor power module 22 only turns off, the power-source voltage Ed is applied to the power module 22. Then, if the breakdown voltage of the power module 22 is lower than the power-supply voltage Ed, the power module 22 will result in breakdown.

Also, when some of the semiconductor power modules 22–25 are ON, if other semiconductor power modules turn on, which are to turn off, due to an abnormal operation of the three-level inverter, excessive short-circuit current flows as collector current and the overcurrent protection circuit operates to cut off the excessive collector current, and then a high surge voltage resulted from the inductive component existing in the power-supply interconnection and the like may be applied to the semiconductor power module.

To protect the semiconductor power modules from such abnormal phenomena, the breakdown voltage of each semiconductor power module 22–25 must be set higher with respect to the power-supply voltage Ed. For example, the breakdown voltage of the IGBT included in the semiconductor power modules 22–25 used in a three-level inverter having its rated voltage of 1500 V had to be set to 2000 V. That is to say, conventional three-level inverters can not fully make use of its original good point.

Furthermore, self arc-suppression type elements, such as IGBT, have a tendency that the switching loss and the steady ON-loss increase if the breakdown voltage of the elements is set higher. Accordingly, when self arc-suppression type elements such as IGBT are used for the semiconductor power modules and the rated voltage of the semiconductor power modules is made high to enhance the breakdown voltage in the three-level inverter, such as the three-level inverter shown in FIG. 15, there has been a problem that the power conversion efficiency of the three-level inverter is degraded.

SUMMARY OF THE INVENTION

According to a first aspect of the present invention, a semiconductor power module comprises: (a) a switching semiconductor element having first and second main electrodes which are a pair of main electrodes and a control electrode, and capable of controlling a main current flowing between the pair of main electrodes in response to a control signal inputted to the control electrode; (b) control means responsive to an input signal inputted from the outside to send the control signal; (c) overcurrent protection means for realizing a conducting state between the first main electrode and the control electrode when the main current exceeds a predetermined reference value to cut off between the pair of main electrodes; (d) clamp means having its one end connected to the second main electrode and the other end connected to the control electrode, which becomes conductive when a voltage exceeding a predetermined reference voltage is applied; and (e) cancelling means for cancelling operation of the overcurrent protection means when the clamp means becomes conductive.

According to the first aspect of the present invention, if an excessive voltage is applied between the pair of main electrodes of the semiconductor power module when an abnormality takes place, for example, and the voltage applied to the clamp means exceeds the reference voltage, the clamp means becomes conductive and a current flows in the clamp means, with the result that a signal for making the switching semiconductor element conductive is applied to the control electrode. The voltage between the pair of main electrodes is maintained to a predetermined value or below by this negative feedback action of a kind. At this time, since the switching semiconductor element is out of the cut-off state, most part of the load current which will cause an overvoltage flows in the switching semiconductor element and only a little flows to the clamp means. Accordingly, overheat of and damage by burning to the circuit elements forming the clamp means are prevented.

Furthermore, even if the overcurrent protection means is operating because of occurrence of a main current exceeding the reference value, or an overcurrent, the operation of the overcurrent protection means is cancelled when the clamp means becomes conductive, so that the clamp means operates without hindered by the overcurrent protection means. Accordingly, even when the overcurrent protection means cuts off the switching semiconductor element after occurrence of an overcurrent to cause an overvoltage, most of the overcurrent causing the overvoltage flows in the switching semiconductor element and only a little of it flows to the clamp means. Accordingly, overheat and damage by burning to the circuit elements forming the clamp means are prevented. Also, since the clamp means is provided to the semiconductor power module itself, delay in response of the clamp means is suppressed low.

As discussed above, as the clamp means operates safely and stably, excessive margin does not need to be allowed for the breakdown voltage of the switching semiconductor element. This further results in downsizing of chip size of the switching semiconductor element, and also results in downsizing of the semiconductor power module and an applied equipment, such as a power conversion device.

Preferably, in accordance with the semiconductor power module according to the present invention, the clamp means comprises, (d-1) a constant-voltage element defining the predetermined reference voltage.

Preferably, in accordance with the semiconductor power module according to the present invention, the constant-voltage element comprises, (d-1-1) a Zener diode.

Preferably, in accordance with the semiconductor power module according to the present invention, the clamp means further comprises, (d-2) a diode interposed between the Zener diode and the control electrode in a direction which is a forward direction with respect to a clamp current flowing when the clamp means becomes conductive.

Preferably, in accordance with the semiconductor power module according to the present invention, the clamp means further comprises, (d-3) a clamp current limiting resistance element connected in series to the diode.

Preferably, the semiconductor power module according to the present invention further comprises; (f) a free wheel diode having its one end connected to the first main electrode and the other end connected to the second main electrode in a direction which is inverse-parallel connection with respect to the switching semiconductor element.

Preferably, in accordance with the semiconductor power module according to the present invention, the first main electrode of the switching semiconductor element has a large main electrode through which main part of the main current flows and a small main electrode through which a small current in proportion to the main current flows, the overcurrent protection means comprises, (c-1) a sensing resistance having its one end connected to the small main electrode, (c-2) with the control means taken as first control means, second control means for detecting a sensing voltage generated in the sensing resistance and outputting an overcurrent detection signal when the sensing voltage exceeds a predetermined reference voltage value, and (c-3) switch means which has its one end connected to the control electrode and the other end connected to the large main electrode and becomes conductive in response to the overcurrent detection signal, and the cancelling means cancels conduction of the switch means which is made in response to the overcurrent detection signal when the clamp means becomes conductive.

Preferably, in accordance with the semiconductor power module according to the present invention, the switch means comprises, (c-3-1) an overcurrent blocking transistor having a collector electrode, an emitter electrode and a base electrode, the collector electrode being connected to the control electrode, the emitter electrode being connected to the large main electrode, and the base electrode being connected to the second control means, where the overcurrent detection signal is inputted to the base electrode and then it becomes conductive between the collector electrode and the emitter electrode, and the cancelling means comprises, (e-1) clamp conduction detection means for detecting whether the clamp means is conducting or not, and (e-2) with the switch means taken as first switch means, second switch means which has its one end connected to the base electrode and the other end connected to the emitter electrode, and becomes conductive when the clamp conduction detection means detects conduction.

Preferably, in accordance with the semiconductor power module according to the present invention, the clamp means comprises, (d-1) a Zener diode having its one end connected to the second main electrode in an opposite direction to the clamp current flowing in the clamp means when the clamp means becomes conductive, and (d-2) a series circuit having a diode in a forward direction with respect to the clamp current and a resistance element connected in series, and having its one end connected to the other end of the Zener diode and the other end connected to the control electrode, the second switch means comprises, (e-2-1) with the base electrode, the collector electrode and the emitter electrode taken as a first base electrode, a first collector electrode and a first emitter electrode, respectively, a cancelling transistor having a second base electrode, a second collector electrode connected to the first base electrode and a second emitter electrode connected to the first emitter electrode, and the clamp conduction detection means comprises, (e-1-1) a clamp current detection circuit having its first end connected to the other end of the Zener diode, its second end connected to the second emitter electrode and its third end connected to the second base electrode for outputting a signal corresponding to a detection current flowing between the first end and the second end from the third end to the second base electrode so that current having its magnitude being in proportion to the detection current flows to the cancelling transistor.

Preferably, in accordance with the semiconductor power module according to the present invention, the clamp current detection circuit comprises, (e-2-1) with the resistance element taken as a first resistance element, a second resistance element having its one end coupled to the Zener diode, and (e-2-2) a clamp current detecting transistor having a third collector electrode connected to the other end of the second resistance element, a third base electrode connected to both the second base electrode and the third collector and a third emitter electrode connected to the second emitter electrode.

Preferably, in accordance with the semiconductor power module according to the present invention, with the overcurrent detection signal taken as a first overcurrent detection signal, the second control means further outputs a second overcurrent detection signal prior to the first overcurrent detection signal when the sensing voltage exceeds a predetermined reference voltage value, and the overcurrent protection means further comprises, (c-4) overcurrent limiting means having its one end connected to the control electrode and the other end connected to the large main electrode, and having its resistance value becoming finite in response to the second overcurrent detection signal to limit a magnitude of the main current to a predetermined finite value.

Preferably, in accordance with the semiconductor power module according to the present invention, the overcurrent limiting means comprises, (c-4-1) an overcurrent limiting resistance element having its one end connected to the control electrode, and (c-4-2) an overcurrent limiting transistor having a collector electrode connected to the other end of the overcurrent limiting resistance, an emitter electrode connected to the large main electrode and a base electrode connected to the second control means, where the second overcurrent detection signal is inputted to the base electrode and then the collector electrode and the emitter electrode become conductive therebetween.

Preferably, in accordance with the semiconductor power module according to the present invention, the switching semiconductor element comprises, (a-1) an insulated gate type bipolar transistor having an emitter electrode functioning as the large main electrode, a sensing electrode functioning as the small main electrode, a collector electrode functioning as the second electrode and a gate electrode functioning as the control electrode.

Preferably, the semiconductor power module according to a second aspect of the present invention further comprises; (f) a diode having its one end connected to the first main electrode and the other end coupled to the control electrode, the diode being provided in a direction to prevent part of a clamp current flowing in the clamp means when the clamp means becomes conductive from flowing in the diode.

According to the device of the second aspect of the present invention, the clamp means becomes conductive when an overvoltage occurs and a current flows to the clamp means, and then, the main current starts flowing to the switching semiconductor element and the current which has been flowing in the clamp means, i.e., the clamp current decreases. As this device includes a diode, the decreased current component flows back in a loop including the clamp means, the switching semiconductor element and the diode. Accordingly, it is avoided that the decreased current component causes application of unnecessary voltage, such as reverse voltage, to other parts of the device, such as the cancelling means.

Preferably, in accordance with the semiconductor power module according to the present invention, the clamp means comprises, (d-1) a Zener diode having its one end connected to the second main electrode in an opposite direction to the clamp current flowing in the clamp means when the clamp means becomes conductive, and (d-2) with the diode taken as a first diode, a series circuit having a second diode in a forward direction with respect to the clamp current and a resistance element connected in series, and having its one end connected to the other end of the Zener diode and the other end connected to the control electrode, and the first diode having its one end connected to the first main electrode and the other end connected to the other end of the Zener diode.

Preferably, in accordance with the semiconductor power module according to a third aspect of the present invention, the cancelling means cancels operation of the overcurrent protection means when the clamp means becomes conductive and sends a predetermined error signal to the outside.

According to the device of the third aspect of the invention, as a predetermined error signal is sent to the outside when the clamp means becomes conductive, measures can be taken, such as to stop operation of the device on the basis of the sent error signal in a power conversion device including this device, for example.

Preferably, in accordance with the semiconductor power module according to a fourth aspect of the present invention, the cancelling means and the clamp means are coupled so that a current flowing in the clamp means when the clamp means becomes conductive is divided to the cancelling means, the cancelling means operates when the divided current component exceeds a predetermined reference value, and the semiconductor power module further comprises; (g) a resistance interposed between a path of the current component flowing between the clamp means and the cancelling means and the first main electrode.

According to the device of the fourth aspect of the present invention, the clamp current caused by the capacitance parasitically existing in the clamp means when the switching semiconductor element changes from a conducting state to cut-off in normal operation is by-passed through the resistance. Accordingly, the cancelling means which detects conduction of the clamp means on the basis of the magnitude of the current components, or the divided clamp current, is prevented from unnecessarily operating in the normal operation.

Preferably, in accordance with the semiconductor power module according to a fifth aspect of the present invention, the switching semiconductor element includes an even number of unit switching elements and the unit switching elements are provided symmetrically with the clamp means interposed therebetween.

According to the device of the fifth aspect of the present invention, as an even number of unit switching semiconductor elements are symmetrically arranged with the clamping means interposed therebetween, the clamp means acts equally to the unit switching semiconductor elements.

The present invention is also directed to a power conversion device. According to a sixth aspect of the present invention, the power conversion device comprises: (a) switching means interposed between a high potential side DC bus and a low potential side DC bus; the switching means comprising, (a-1) a plurality of semiconductor power modules connected in series, each of the plurality of semiconductor power modules comprising, (a-1-1) a switching semiconductor element having first and second main electrodes which are a pair of main electrodes and a control electrode and capable of controlling a main current flowing between the pair of main electrodes in response to a control signal inputted to the control electrode, (a-1-2) control means responsive to an input signal inputted from the outside to send the control signal, (a-1-3) overcurrent protection means for realizing a conducting state between the first main electrode and the control electrode when the main current exceeds a predetermine reference value to cut off between the pair of main electrodes, (a-1-4) clamp means having its one end connected to the second main electrode and the other end connected to the control electrode and which becomes conductive when a voltage exceeding a predetermined reference voltage is applied, and (a-1-5) cancelling means for cancelling operation of the overcurrent protection means when the clamp means becomes conductive and sending a predetermined error signal to the outside, and the power conversion device further comprises, (b) gate control means for sending the input signal to each of the plurality of semiconductor power modules, and (c) cutting off means for cutting off all of the plurality of semiconductor power modules when at least one of the plurality of semiconductor power modules sends the predetermined error signal.

According to the device of the sixth aspect of the present invention, all the semiconductor power modules are cut off on the basis of the error signal. Accordingly, when a semiconductor power module is cut off when it is to be conducting and an overvoltage is applied to this semiconductor power module, an error signal is sent from this semiconductor power module and all the semiconductor power modules are cut off. As a result, it is prevented that an overvoltage is continuously applied to a certain semiconductor power module, and then the semiconductor power modules can be prevented from overheat and damage.

That is to say, as the clamp means operates safely and stably, it is not necessary to allow excessive margin for the breakdown voltage of the semiconductor power modules. Or, by using semiconductor power modules having certain breakdown voltage, a power conversion device having high voltage rating can be realized. Also, since there is no need of increasing the breakdown voltage of the semiconductor power modules, the voltage rating of a power conversion device can be enhanced without increasing the switching loss or the steady ON loss while maintaining power conversion efficiency at a similar level to the conventional devices.

Further, as there is no need of allowing excessive margin for the breakdown voltage of the semiconductor power modules, the chip size of the switching semiconductor elements included in the semiconductor power module can be reduced. This contributes to downsize the semiconductor power modules and power conversion devices.

Preferably, in accordance with the power conversion device according to the present invention, the overcurrent protection means comprises, (a-1-3-1) with the error signal taken as a first error signal, error signal sending means for sending a predetermined second error signal to the outside when the main current exceeds the predetermined reference value, and the cutting off means comprises, (c-1) means for cutting off all of the plurality of semiconductor power modules when at least one of the plurality of semiconductor power modules sends either the predetermined first error signal or second error signal.

Preferably, in accordance with the power conversion device according to a seventh aspect of the present invention, after the cutting off means starts operating, the operation continues until a reset signal is inputted from the outside.

According to the device of the seventh aspect of the present invention, when the cut-off means starts operating, its operation continues until a reset signal is inputted, so that the inconvenience of repeating the abnormal operation caused because the device starts operating again with a cause of an abnormality remained can be avoided.

Preferably, the power conversion device according to an eighth aspect of the present invention further comprises (d) error display means for, when at least one of the plurality of semiconductor power modules sends the error signal, continuously displaying the fact that the error signal was sent and information indicating which semiconductor power module sent the error signal in a period from when the error signal was sent until when a reset signal is inputted from the outside.

According to the device of the eighth aspect of the present invention, as the error display means is provided, an operator can recognize occurrence of an abnormality in the power conversion device and can specify a semiconductor power module with the abnormal operation. Accordingly, a cause of the abnormality can be easily pursued and removed.

Accordingly, it is an object of the present invention to present a semiconductor power module with stable protection from an overvoltage, and to present a power conversion device capable of application of a high power-supply voltage without increasing the breakdown voltage of semiconductor elements, and accordingly, without deteriorating the power conversion efficiency.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a description diagram for describing the normal operation of the three-level inverter.

FIG. 17 is a timing chart for describing the normal operation of the three-level inverter.

DESCRIPTION OF THE PREFERRED EMBODIMENTS

Preferred embodiments of the present invention will now be described.

<1. First Preferred Embodiment>

First, a semiconductor power module of the first preferred embodiment of the present invention will be described.

<1-1. Appearance and Internal Structure>

Figure 2:
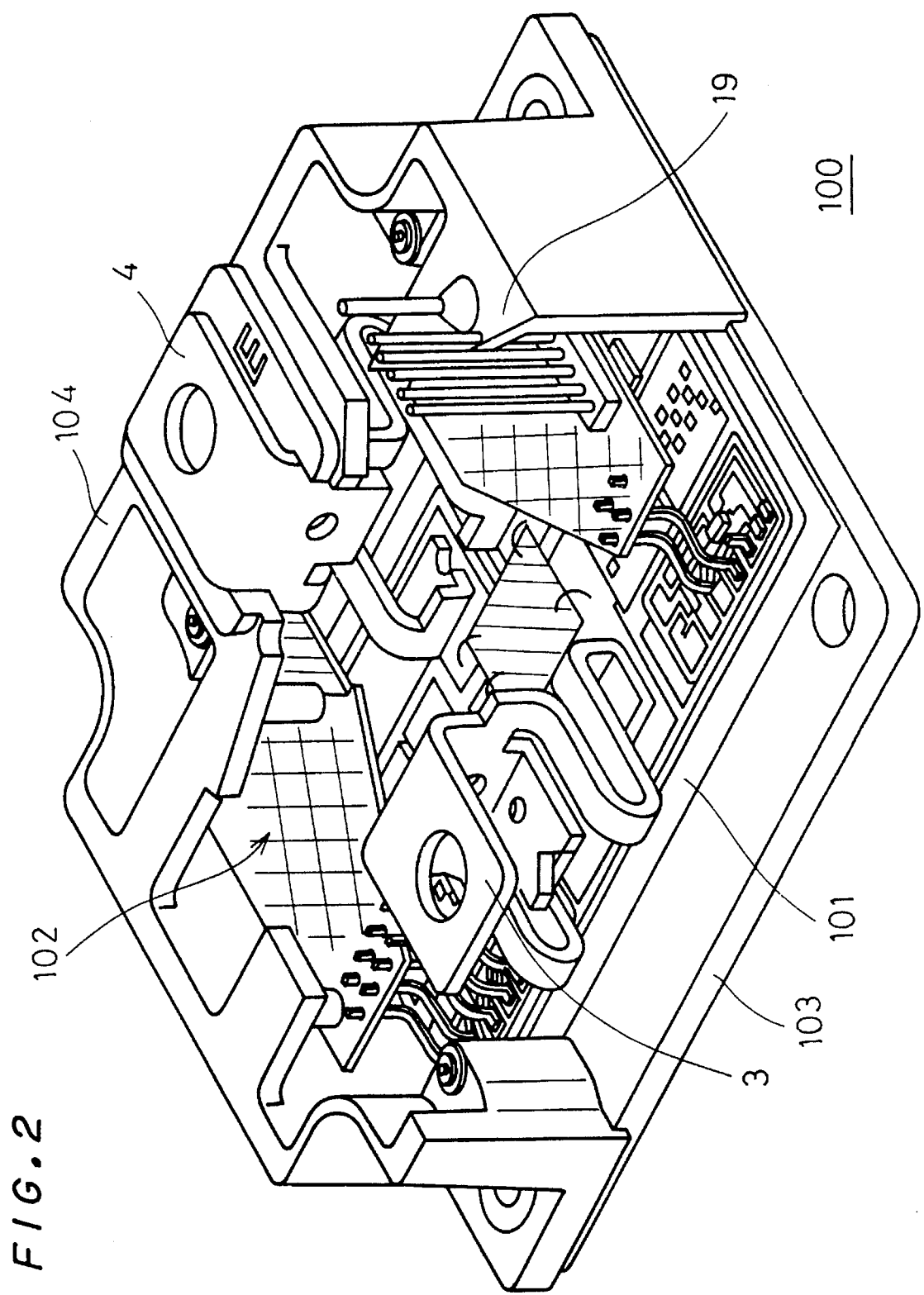
FIG. 2 is a partially cutaway perspective view of the semiconductor power module of the first preferred embodiment.

FIG. 2 is a partially cutaway perspective view of a semiconductor power module in one preferred embodiment of the present invention, which simultaneously shows both the appearance and the internal structure of this semiconductor power module. As shown in FIG. 2, in this semiconductor power module 100, a radiation board 103 is provided at the bottom and a main circuit board 101 is fixed on its upper surface. Provided above the main circuit board 101 is a control circuit board 102. These two circuit boards are accommodated in a case 104 formed of insulator, such as synthetic resin.

Circuit parts forming the main circuit of the semiconductor power module 100 are developed on the main circuit board 101 and circuit parts forming the control circuit are developed on the control circuit board 102. A collector electrode 3 and an emitter electrode 4 connected to the main circuit board 101 are exposed from the upper surface of the case 104 and five control electrodes 19 connected to the control circuit board 102 are also exposed therefrom.

As described above, in the semiconductor power module 100, the main circuit board 101 in which large current flows and the control circuit board 102 in which fine signal current flows are arranged above and below facing to each other to downsize. The two circuit boards are separated from each other to prevent malfunction of the control circuit caused by the large amount of heat generated in the main circuit. Also, as the main circuit board 101 generating the large amount of heat is fixed on the radiation board 103, radiation of heat is made efficiently.

<1-2. Outline of Circuit Structure and Operation>

Figure 3:
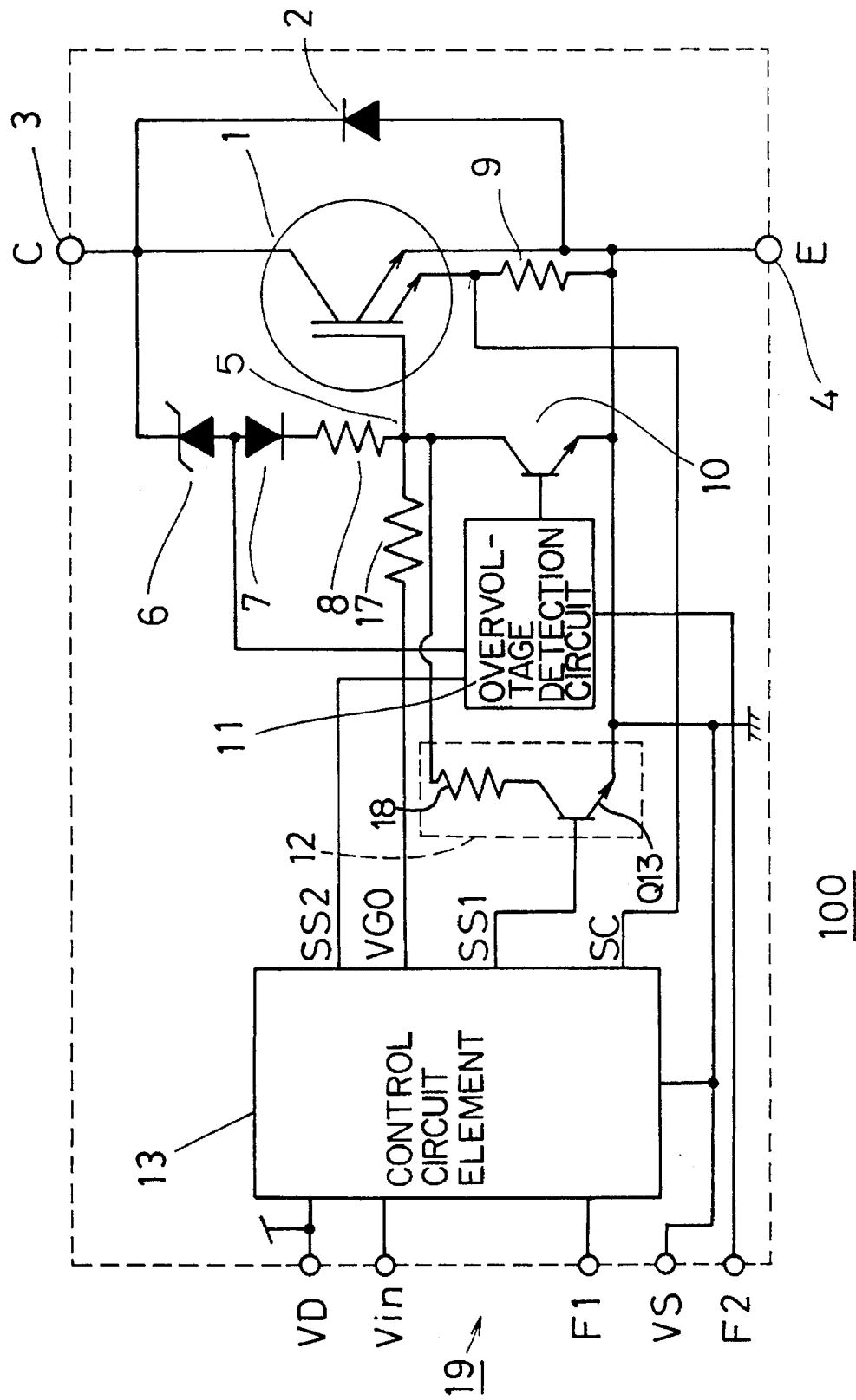
FIG. 3 is a circuit diagram of the semiconductor power module of the first preferred embodiment.
Figure 14:
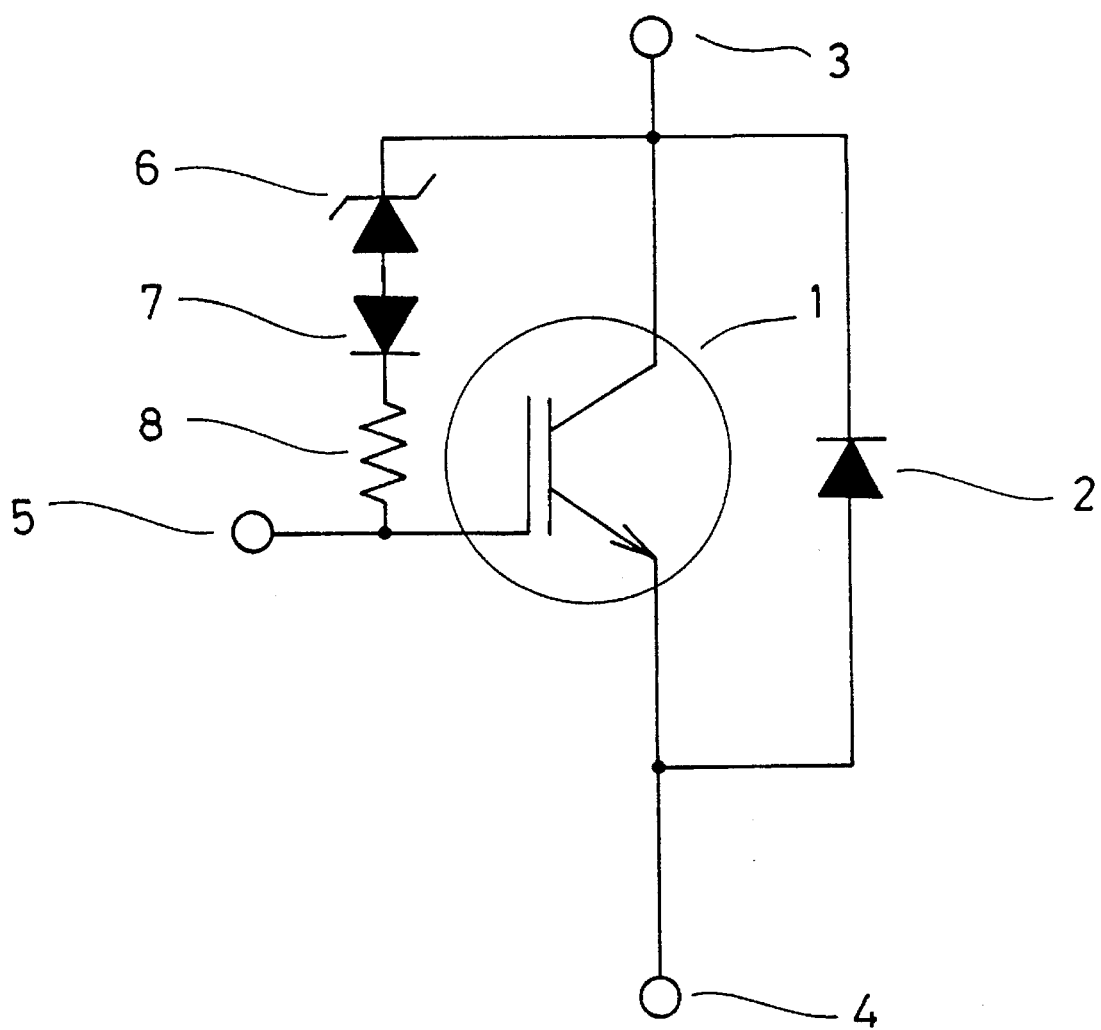
FIG. 14 is a circuit diagram of a main part of a conventional semiconductor power module.

FIG. 3 is a circuit diagram showing the circuit structure of the semiconductor power module 100. In the figures below, the same characters are allotted to the same parts as those of the conventional semiconductor power module shown in FIG. 14 and FIG. 15 and detailed description thereof is not repeated.

An IGBT 1 is used as a switching semiconductor element in the semiconductor power module 100. A free wheel diode 2 is connected to the IGBT 1 in parallel. The free wheel diode 2 is connected so that its forward direction is opposite to the forward direction of the IGBT 1, that is, in the inverse-parallel connection with respect to the IGBT 1. A clamping circuit having a Zener diode 6, a diode 7 and a resistor 8 connected in series is connected between a collector electrode 3 and a gate electrode 5.

The clamp voltage is determined by the Zener voltage of the Zener diode 6. The diode 7 connected in the inverse-series manner to the Zener diode 6 functions to prevent reverse flow of the clamp current and to prevent oscillation of the IGBT 1. The resistor 8 functions to improve the current dependence of the clamp voltage and serves as a limiting resistance for limiting the clamp current. Other constant-voltage circuit elements (which do not become conductive at or under a certain voltage but become conductive when it exceeds the certain voltage), such as a varistor, may be used instead of the Zener diode 6. However, the Zener diode 6 has excellent characteristics such as fast response, small dependance of the Zener voltage on the temperature, etc., which is particularly suitable for the clamping circuit of the semiconductor power module 100.

The rated voltage and the rated current of the IGBT 1 are respectively 1700 V and 600 A, for example. The clamp voltage is set lower than the rated voltage of the IGBT 1, which is set to about 1400 V to 1650 V, for example.

A large number of IGBT units not shown are built in the semiconductor chip forming the IGBT 1 and those IGBT units are connected to one another in parallel. The collector current is equally divided to each of the IGBT units. Accordingly, part of the IGBT units are utilized as sensing IGBT (referred to as sense IGBT) for measuring the collector current flowing in the IGBT 1. A sense resistor 9 is connected to the emitter electrode of the sense IGBT, and in the sense resistor 9 a voltage in proportion to the collector current of the IGBT 1 is generated. The resistance value of the sense resistor 9 is about several 10 to 100Ω, for example.

The gate electrode of the IGBT 1 is connected to a control circuit element 13 through a gate resistor 17. The control circuit element 13 is an integrated circuit element, which is responsive to an input signal Vin inputted from outside to send a gate voltage signal VG0 to the gate electrode of the IGBT 1. The IGBT 1 performs OFF operation and ON operation in response to the gate voltage signal VG0.

An RTC (Real Time Gate Control) circuit 12 and a sink transistor 10 are connected between the gate electrode of the IGBT 1 and the emitter electrode 4 in parallel. These RTC circuit 12 and sink transistor 10 both prevent overcurrent flowing to the IGBT 1. The voltage generated in the sense resistor 9 is inputted to the control circuit element 13 as an overcurrent detection signal SC.

The control circuit element 13 makes a determination that an excessive collector current flowed to the IGBT 1 when the overcurrent detection signal SC exceeds a predetermined reference value and sends a drive signal SS1 to the RTC circuit 12 and somewhat later sends a drive signal SS2 to the sink transistor 10. The RTC circuit 12 operates in response to the drive signal SS1 to control the collector current of the IGBT 1. Further, the sink transistor 10 operates in response to the drive signal SS2 to bring the IGBT 1 to the OFF state.

The sink transistor 10 responds not only to the drive signal SS2 but also to drive signal from an overvoltage detection circuit 11 to operate. That is to say, the overvoltage detection circuit 11 makes a detection as to whether the clamping circuit is in the conducting state or not through the signal line connected to the connection between the Zener diode 6 and the diode 7. When the clamping circuit is in the conducting state, i.e., in the break over state in which the clamp current flows, it sends a drive signal so that the sink transistor 10 turns off. As will be described later, this prevents overheat of and damage to the elements forming the clamping circuit.

As has been describe above, the semiconductor power module 100 has five control electrodes 19. Two of them supply a high potential side power-supply voltage VD and a low potential side power-supply voltage VS to the control circuit element 13 and the overvoltage detection circuit 11. The low potential side power-supply voltage VS is at equal potential to the potential of the emitter electrode 4. One of the control electrodes 19 transmits the above-described input signal Vin to the control circuit element 13. The remaining two are electrodes for sending error signals F1 and F2 to outside, respectively. The error signal F1 is a signal which is sent when the control circuit element 13 detects an overcurrent, and the other error signal F2 is a signal which is sent when the overvoltage detection circuit 11 detects an overvoltage.

<1-3. RTC Circuit 12 and Sink Transistor 10>

Figure 1:
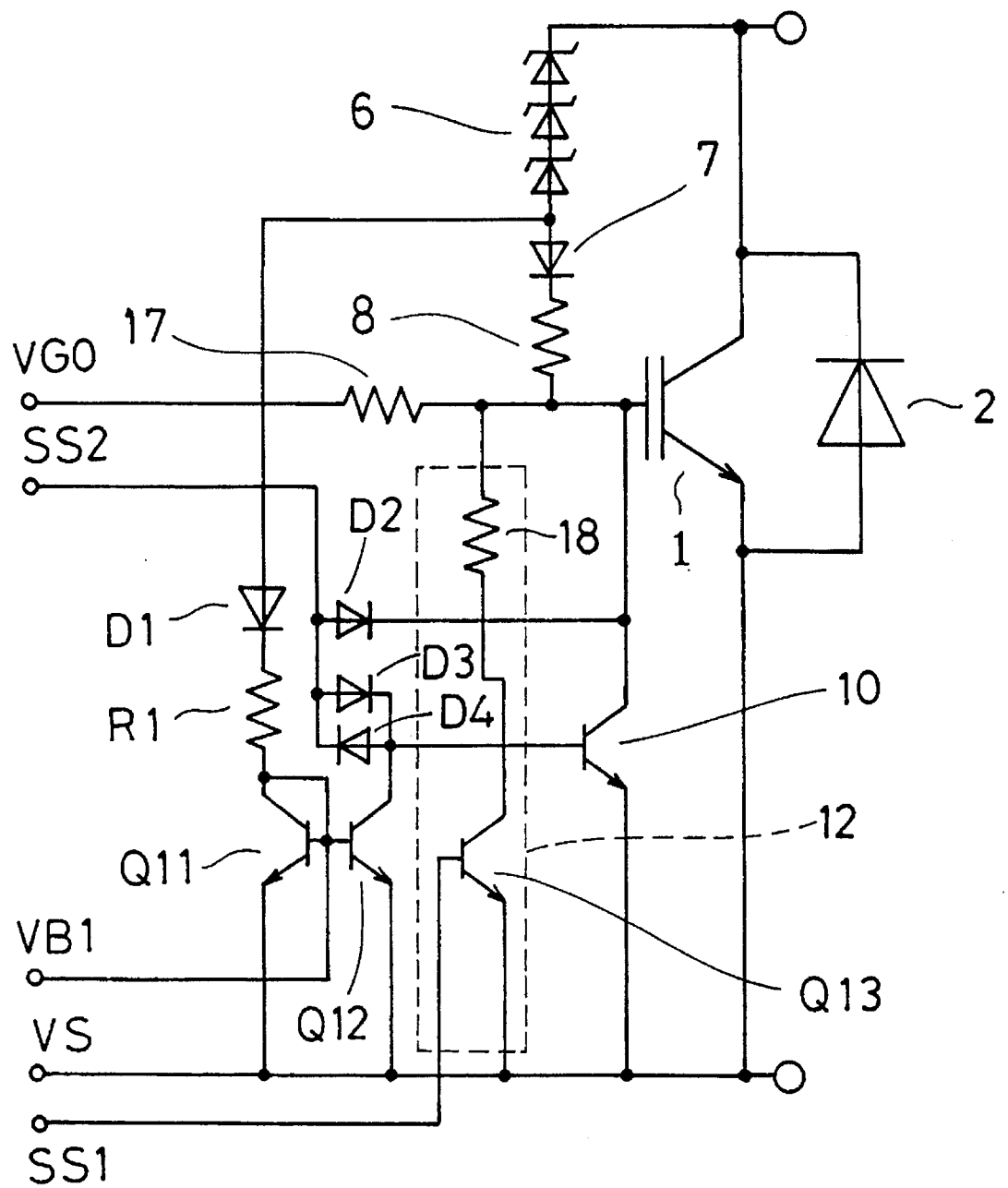
FIG. 1 is a circuit diagram of a semiconductor power module of the first preferred embodiment.
Figure 4:
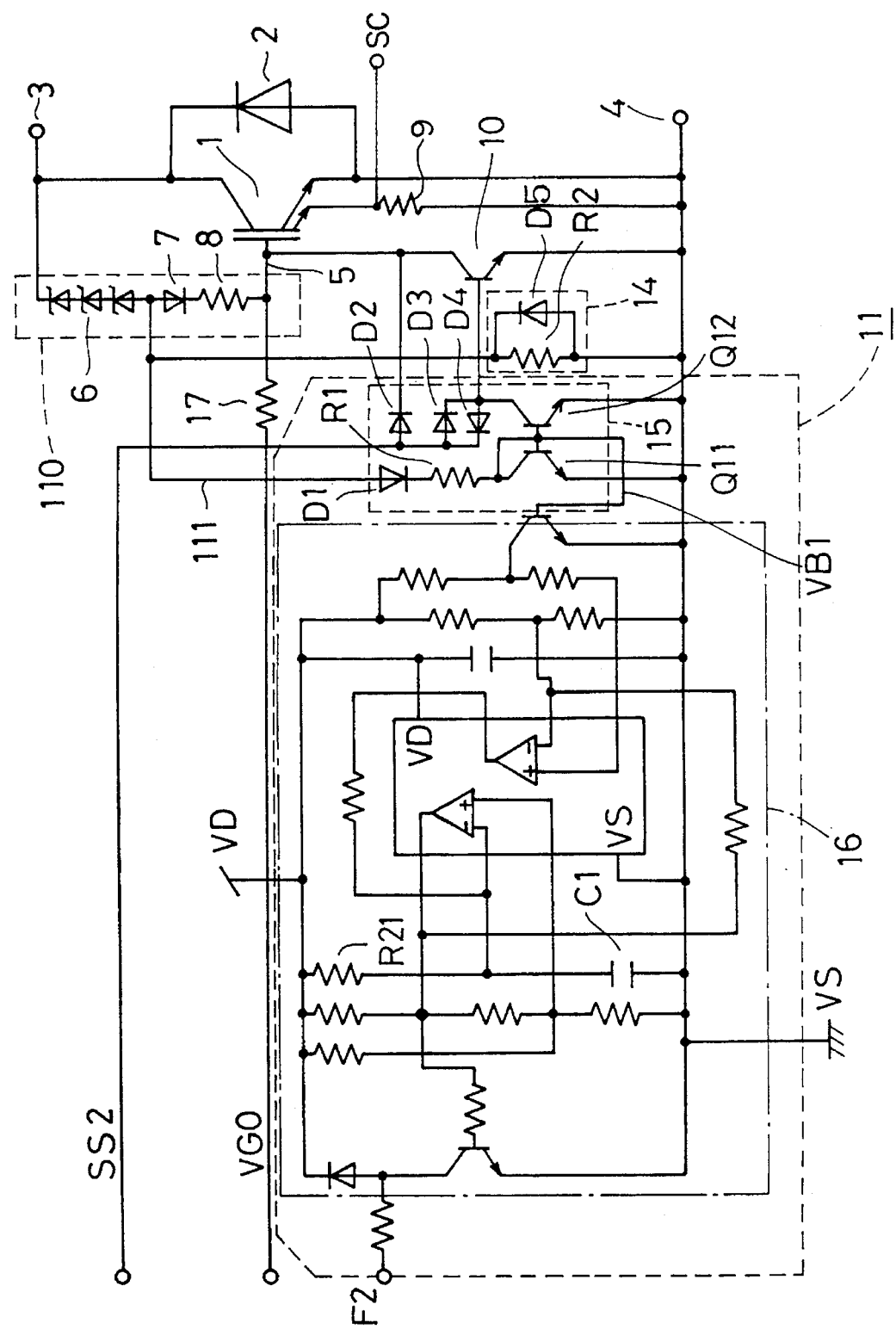
FIG. 4 is a circuit diagram of the semiconductor power module of the first preferred embodiment.

FIG. 4 and FIG. 1 are circuit diagrams showing the structure of the overvoltage detection circuit 11 and the RTC circuit 12 in the semiconductor power module 100 especially in detail. In the description below, referring to FIG. 4 and FIG. 1, the characteristic structure and operation of the semiconductor power module 100 will be described. First, the RTC circuit 12 and the sink transistor 10 will be described.

The IGBT 1 turns on if the voltage of the gate electrode 5 relative to the emitter electrode 4, or the gate voltage VG exceeds the gate threshold voltage Vth peculiar to the IGBT 1, and turns off if it is lower than the gate threshold voltage Vth. Accordingly, in the normal operation, the control circuit element 13 sends a voltage higher than the gate threshold voltage Vth as the gate voltage signal VG0 when to turn on the IGBT 1, and sends a zero voltage to bring it to a perfect OFF state when to turn off the IGBT 1. The gate threshold voltage Vth of the IGBT 1 is set to a value around 5 V, for example.

The RTC circuit 12 interposed between the gate electrode 5 and the emitter electrode 4 has a transistor Q13 and a resistor 18 connected in series. This resistor 18 is interposed between the collector electrode of the transistor Q13 and the gate electrode 5 of the IGBT 1. The drive signal SS1 is inputted to the base electrode of the transistor Q13. When the drive signal SS1 goes active, or a high level voltage (indicated as "H" hereinafter), the transistor Q13 turns on. As a result, the gate voltage VG becomes a voltage obtained by dividing the gate voltage signal VG0 by the gate resistor 17 and the resistor 18. That is to say, when the RTC circuit 12 operates in response to the drive signal SS1, the gate voltage VG is limited. At this time, the IGBT 1 is not in a complete OFF state, and the collector current is suppressed to a finite value which is not zero. The gate resistor 17 and the resistor 18 are respectively set to about several tens $\Omega$, for example.

When the drive signal SS2 goes active, or "H", a high level voltage is inputted to the base electrode of the sink transistor 10 through the diode D3 if the clamping circuit 110 is not in the break over state. As a result, the sink transistor 10 turns on, the gate voltage VG is lowered to zero voltage, and the IGBT 1 turns off. That is to say, the collector current of the IGBT 1 is cut off.

As described above, in the semiconductor power module 100, after the overcurrent is detected, the IGBT 1 moves from the ON state to the OFF state in two steps. That is, in the semiconductor power module 100, the overcurrent is not cut off rapidly, but it is led to cut-off in steps to suppress generation of a surge voltage low.

<1-4. Clamping Circuit 110>

If an overcurrent is applied between the collector electrode 3 and the emitter electrode 4 when the IGBT 1 is in the OFF state due to some abnormality, the clamping circuit 110 breaks over and the clamp current flows to the clamping circuit 110 as described above. The clamp current flows to the gate electrode 5 of the IGBT 1. As a result, the gate capacitance parasitically existing in the gate electrode 5 is charged and then the gate voltage VG is increased and held at the gate threshold voltage Vth by a kind of negative-feedback effect. Accordingly, the collector current flows in the IGBT 1. At this time, the collector voltage of the IGBT 1 is maintained to coincide with the clamp voltage. The clamping circuit 110 operates in this way to protect the IGBT 1 from the overvoltage.

Further, when the clamping circuit 110 breaks over, the clamp current flows, and at the same time, the IGBT 1 gets out of the perfect OFF state and the collector current flows, so that great part of the load current which will cause an overvoltage flows in the IGBT 1 and only a little flows to the clamping circuit 110. In this way, as the damp current flowing in the clamping circuit 110 is kept low, circuit elements forming the clamping circuit 110, i.e., the Zener diode 6, the diode 7 and the resistor 8 are prevented from overheat and damage by burning.

<1-5. Overvoltage Detection Circuit 11>

Furthermore, in the semiconductor power module 100, overheat of and damage by burning to the clamping circuit 110 caused by generation of the overvoltage are also prevented even when the sink transistor 10 is operating with generation of an overcurrent.

For example, if an overcurrent flows to the IGBT 1 due to some abnormality, the RTC circuit 12 and the sink transistor 10 operate to bring the IGBT 1 to the OFF state, and then overvoltage resulted from external inductive component etc. is applied to the IGBT 1. At this time, the clamping circuit 110 breaks over and clamp current flows. This clamp current flows to the gate electrode 5, and at the same time, it generates a voltage in the series circuit of the diode 7 and the resistor 8. This voltage is inputted to a current mirror circuit 15 included in the overvoltage detection circuit 11 through a signal line 111. The resistance value of the resistor 8 is set to about several Ohms, for example.

The current mirror circuit 15 includes a series circuit of a diode D1, a resistor R1 and a transistor Q11 interposed between the signal line 111 and the emitter electrode 4. The collector electrode and the base electrode of the transistor Q11 are shorted. The diode D1 and the resistor R1 are connected on the collector side of the transistor Q11, and the diode D1 is connected in the direction in which its forward direction coincides with the direction of flow of the collector current of the transistor Q11.

Accordingly, current flows to these series circuit in accordance with the voltage inputted through the signal line 111. When the inputted voltage exceeds a certain level, the current exceeds a certain level, and then the transistor Q11 turns on. The resistance value and the like of the resistor 8 are optimized so that the transistor Q11 turns on when the clamping circuit 110 breaks over by the overvoltage.

The diode D1 works to protect the transistor Q11 by blocking reverse current of the transistor Q11. The resistance value of the resistor R1 is set to about several hundreds $\Omega$, for example.

The current mirror circuit 15 further includes a transistor Q12, which has its base electrode and emitter electrode short-connected to the base electrode and the emitter electrode of the transistor Q11, respectively. Accordingly, a collector current with the same magnitude as the transistor Q11 always flows to the transistor Q12. Accordingly, when the clamping circuit 110 breaks over and then the collector current flows to the transistor Q11, the collector current with the same magnitude flows to the transistor Q12, too. Accordingly, the transistor Q11 turns on and thus the transistor Q12 moves to the ON state.

The collector electrode of the transistor Q12 is connected to the base electrode of the sink transistor 10. Accordingly, when the transistor Q12 turns on, the base voltage of the sink transistor 10 is lowered, and as a result, the sink transistor 10 changes from the ON state to the OFF state. That is to say, the operation of the sink transistor 10 is cancelled.

Thus, the clamp current charges the gate capacitance of the IGBT 1, and then the gate voltage VG increases to be held at the gate threshold voltage Vth. Therefore, the collector current flows in the IGBT 1. Accordingly, most part of the overcurrent which causes overvoltage flows in the IGBT 1 and only a little of it flows to the clamping circuit 110. Accordingly, the clamp current flowing in the clamping circuit 110 is controlled low, and overheat of and damage by burning to the circuit elements forming the clamping circuit 110, that is, the Zener diode 6, the diode 7 and the resistor 8 are prevented.

As described above, in the semiconductor power module 100, overheat of and damage by burning to the clamping circuit 110 resulted from generation of the overvoltage are prevented even when the sink transistor 10 is operating with generation of an overcurrent. Further, the clamping circuit 110 is not provided out of the semiconductor power module 100, but it is provided inside the semiconductor power module, similarly to the IGBT 1. Accordingly, delay in response of the clamping circuit 110 is suppressed low.

That is to say, the clamping circuit 110 safely and stably operates in the semiconductor power module 100. Accordingly, excessive margin does no have to be allowed for the breakdown voltage of the IGBT 1. This further results in downsizing of the chip of the IGBT 1, which also contributes to downsize the semiconductor power module 100 and applied equipments thereof.

A diode D3 and a diode D4 connected in inverse-parallel to each other are interposed between the collector electrode of the transistor Q12 and the signal line transmitting the drive signal SS2. Also, a diode D2 is interposed between the collector electrode of the sink transistor 10 and the signal line transmitting the drive signal SS2. The forward direction of the diode D2 is set to a direction from this signal line toward the collector electrode of the sink transistor 10. These diodes D2–D4 function to accelerate turn-off (transition to the OFF state) of the sink transistor 10 by preventing the sink transistor 10 from attaining the saturation state.

<1-6. Overvoltage Error Signal Output Circuit 16>

Further, in the semiconductor power module 100, when the clamping circuit 110 breaks over due to generation of an overvoltage, an error signal F2 is outputted to the outside. This error signal F2 is utilized to protect the IGBTs 1 by cutting off the IGBTs 1 of all the semiconductor power modules 100 in a power conversion device, such as an invertor, including a plurality of semiconductor power modules 100, for example. An example of use of the error signal F2 will be described in another preferred embodiment.

The overvoltage detection circuit 11 includes an overvoltage error signal output circuit 16, by which the error signal F2 is sent out. That is to say, the overvoltage error signal output circuit 16 includes an amplifier, receives the base voltage VB1 of the transistor Q12 as an input signal, and outputs an active signal, or a low level voltage (indicated as "L" hereinafter) for the error signal F2 when this base voltage attains a certain value corresponding to the break over of the clamping circuit 110.

The overvoltage error signal output circuit 16 is supplied with the high potential side power-supply voltage VD and the low potential side power-supply voltage VS similarly to the control circuit element 13, and it operates with them as power source. The overvoltage error signal output circuit 16 is provided with a capacitor C1 and a resistor R21, where a time constant determined by the capacitance of the capacitor C1 and the resistance value of the resistor R21 determines the delay time until when the error signal F2 returns to normal ("H") from active ("L") after the break over of the clamping circuit 110 is cancelled.

<1-7. By-pass Circuit 14>

A by-pass circuit 14 is also provided in the semiconductor power module 100. The by-pass circuit 14 has a resistor R2 and a diode D5 connected in parallel to each other, and it is interposed between the signal line 111 and the emitter electrode 4. The forward direction of the diode D5 is set to the direction from the emitter electrode 4 toward the signal line 111.

The by-pass circuit 14 operates as described below. The Zener diode 6 of the clamping circuit 110 has capacitive component. Accordingly, even in the normal operation, when the IGBT 1 turns from ON to OFF, the collector voltage rises, so that the charge current charging the capacitive component of the Zener diode 6 flows to the clamping circuit 110 in the same way as the clamp current.

Since this charge current is far smaller than the clamp current, it is divided to the resistor R2 included in the by-pass circuit 14 and thus the turn-on of the transistor Q11 is prevented. That is to say, the resistance value of the resistor R2 is optimized to a value in the range where the transistor Q11 turns on with the clamp current and it does not turn on with small charge current. As described above, the by-pass circuit 14 first serves to prevent the current mirror circuit 15 from unnecessarily operating with the charge current in normal operation.

When the clamping circuit 110 breaks over and the clamp current flows, and after that, the collector current starts flowing to the IGBT 1 and the load current is divided to the IGBT 1, the clamp current flowing in the clamping circuit 110 decreases. The decreased component flows back in the loop composed of the clamping circuit 110, the IGBT 1, and the diode D5 of the by-pass circuit 14.

Thus, application of the reverse voltage to other parts of the circuit, such as the current mirror circuit 15, by the decreased component is prevented. That is to say, second, the by-pass circuit 14 serves to form a flow back path of the decreased component of the clamp current.

<1-8. Main Circuit Board 101>

Figure 5:
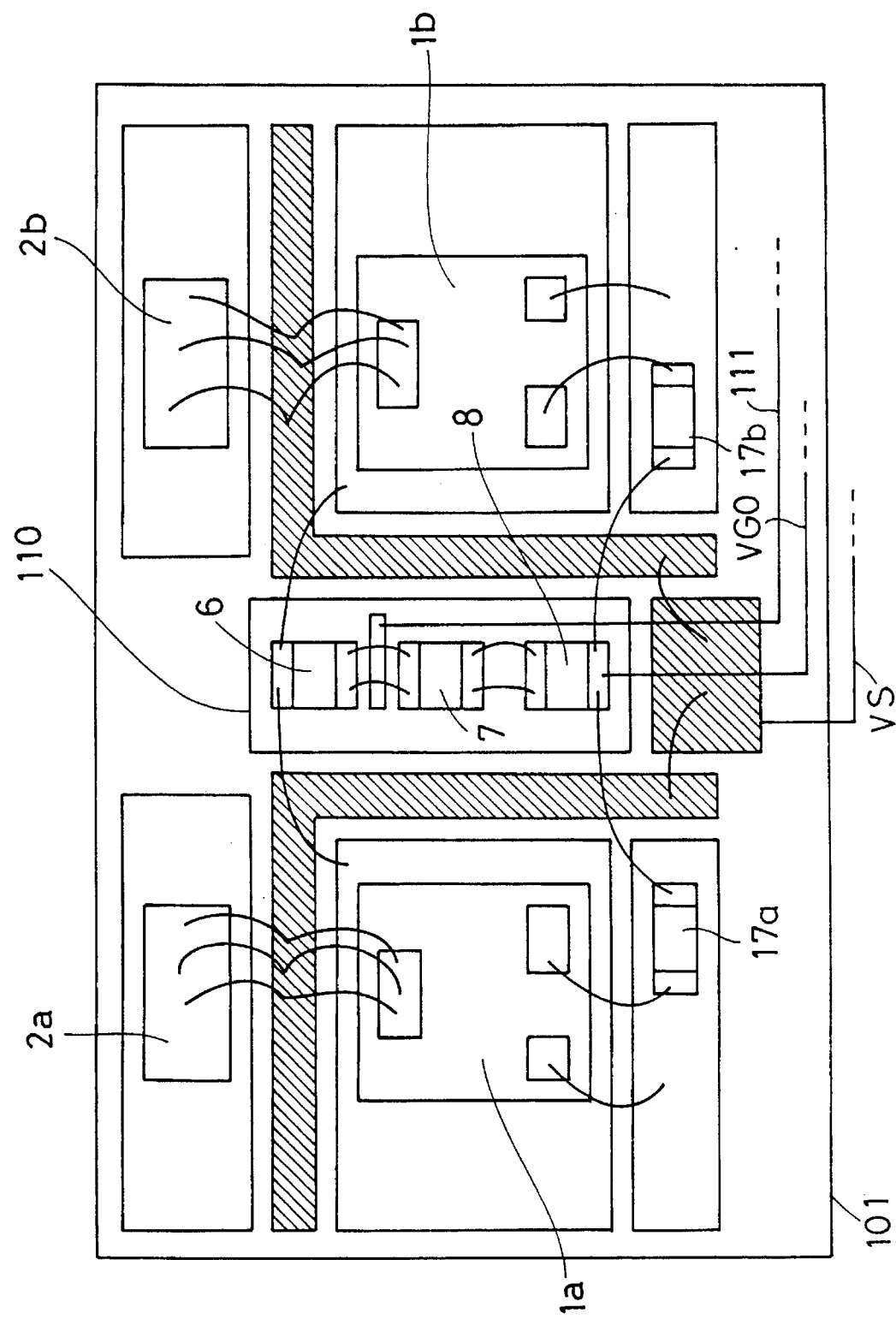
FIG. 5 is a plan view of the main circuit board of the semiconductor power module of the first preferred embodiment.

Next, arrangement of circuit parts on the main circuit board 101 included in the semiconductor power module 100 will be described. FIG. 5 is a plan view of the main circuit board 101 having the parts arranged. Two IGBTs 1a and 1b connected in parallel to each other are provided in this main circuit board 101. These two IGBTs 1a and 1b form the IGBT 1. Accordingly, by setting the current rating of each IGBT 1a, 1b to 300 A, for example, the current rating of the IGBT 1 600 A is realized.

These IGBTs 1a and 1b are symmetrically arranged with respect to the clamping circuit 110 arranged at the center. Accordingly, the clamping circuit 110 functions equally to the two IGBTs 1a and 1b. Accordingly, for example, the overvoltages applied to the IGBTs 1a and 1b are equal to each other, and the collector current flowing in the IGBTs 1a and 1b when an overvoltage occurs is also equal. Further, gate resistors 17a and 17b and free wheel diodes 2a and 2b respectively connected to the IGBTs 1a and 1b are also arranged symmetrically to each other. Accordingly, these circuit parts also operate equally to each other.

The clamping circuit 110 and the IGBTs 1a and 1b are arranged adjacently to each other. Accordingly, the delay in response of the clamping circuit 110 is suppressed to a minimum. Also, the gate resistors 17a and 17b and the free wheel diodes 2a and 2b are arranged adjacent to the IGBTs 1a and 1b. That is to say, respective parts are arranged so that the length of a jumper line electrically connecting the circuit parts is the minimum. Since this suppresses the inductive components accompanying the jumper line low, it is advantageous in that the operation delay of each circuit part is small.

Although an example with two IGBTs 1a and 1b is shown in FIG. 5, the clamping circuit 110 effects equally to each of the IGBTs if generally an even number of IGBTs are arranged symmetrically about each other with the clamping circuit 110 interposed therebetween.

<2-2. Second Preferred Embodiment>

Next, a three-level inverter of the second preferred embodiment will be described.

<2-1. Structure>

Figure 6:
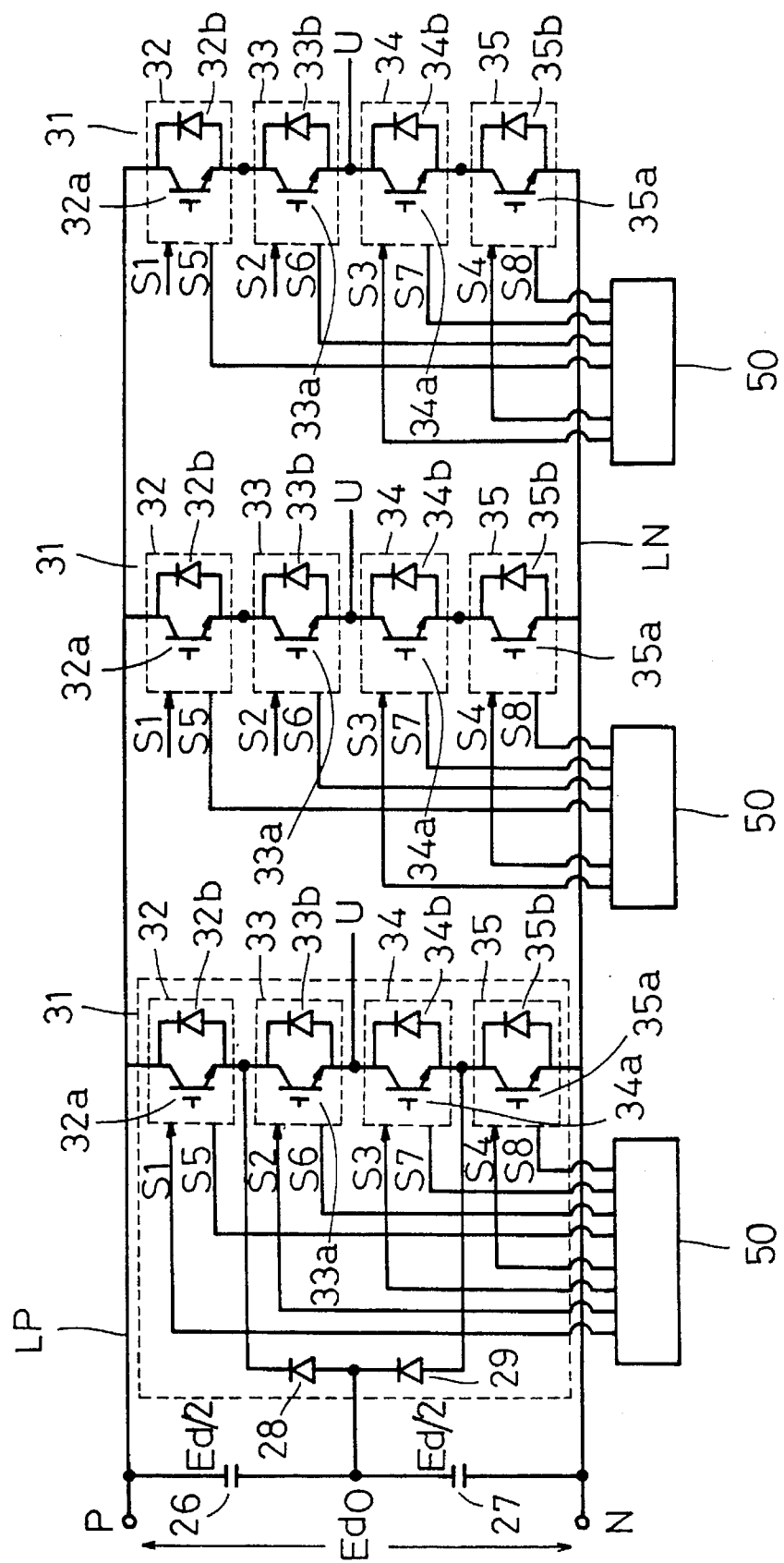
FIG. 6 is a circuit diagram of a three-level inverter of the second preferred embodiment.

FIG. 6 is a circuit diagram showing the entire structure of the three-level inverter in this preferred embodiment. This three-level inverter is made as a three-phase inverter. In this three-level inverter, three switching circuits 31 each corresponding to one phase are connected in parallel between a high potential side DC bus LP connected to a high potential side power-supply terminal P and a low potential side DC bus LN connected to a low potential side power-supply terminal N. A control circuit 50 is connected to each of the switching circuits 31, by which the operation of the switching circuit 31 is controlled.

Figure 15:
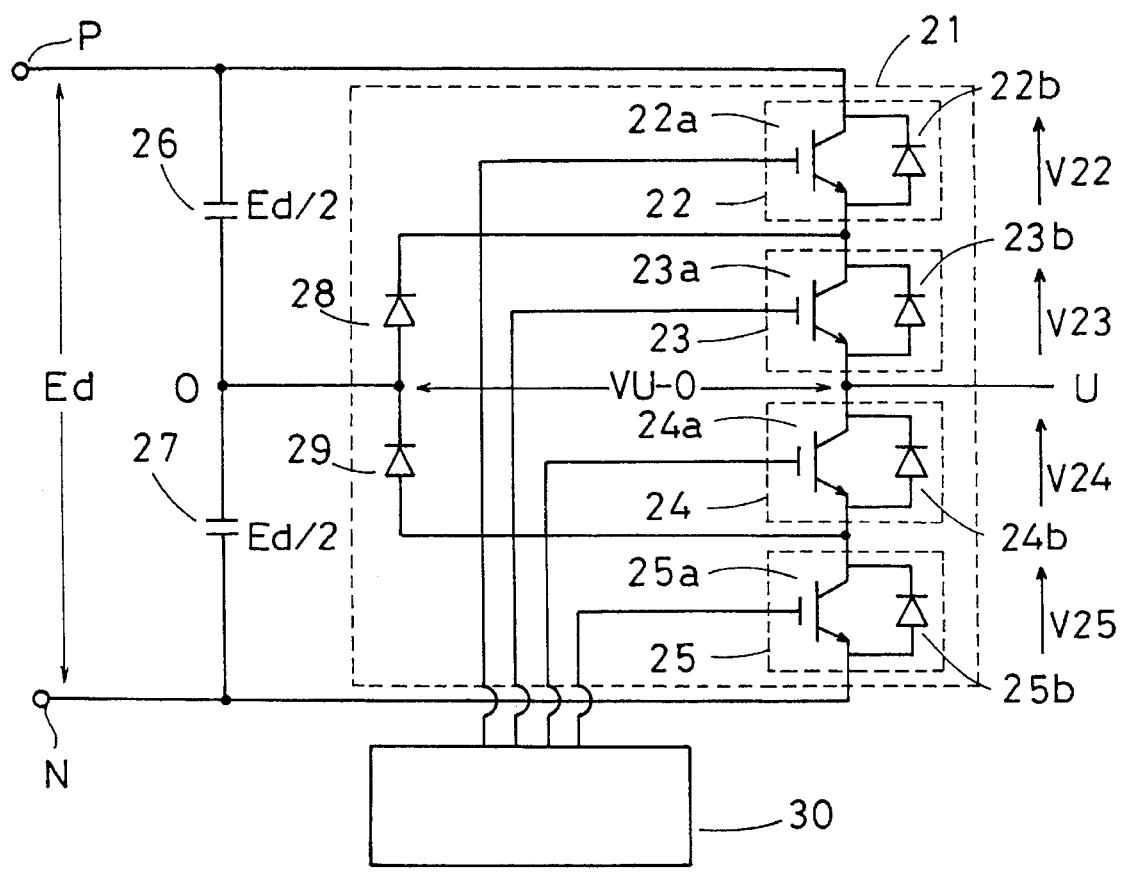
FIG. 15 is a circuit diagram of a conventional three-level inverter.

Similarly to the conventional three-level inverter shown in FIG. 15, a DC power-supply voltage (direct current inter-bus voltage) Ed is applied between the high potential side power-supply terminal P and the low potential side power-supply terminal N from an external power supply. Two capacitors 26 and 27 having capacitance equal to each other and connected in series are interposed between the high potential side DC bus LP and the low potential side DC bus LN, and an intermediate potential point O which is a connection of them holds the intermediate potential between the high potential side DC bus LP and the low potential side DC bus LN. That is to say, when the power-supply voltage Ed is applied between the high potential side power-supply terminal P and the low potential side power-supply terminal N, the potential at the intermediate potential point O in relation to the low potential side DC bus LN is Ed/2.

Figure 7:
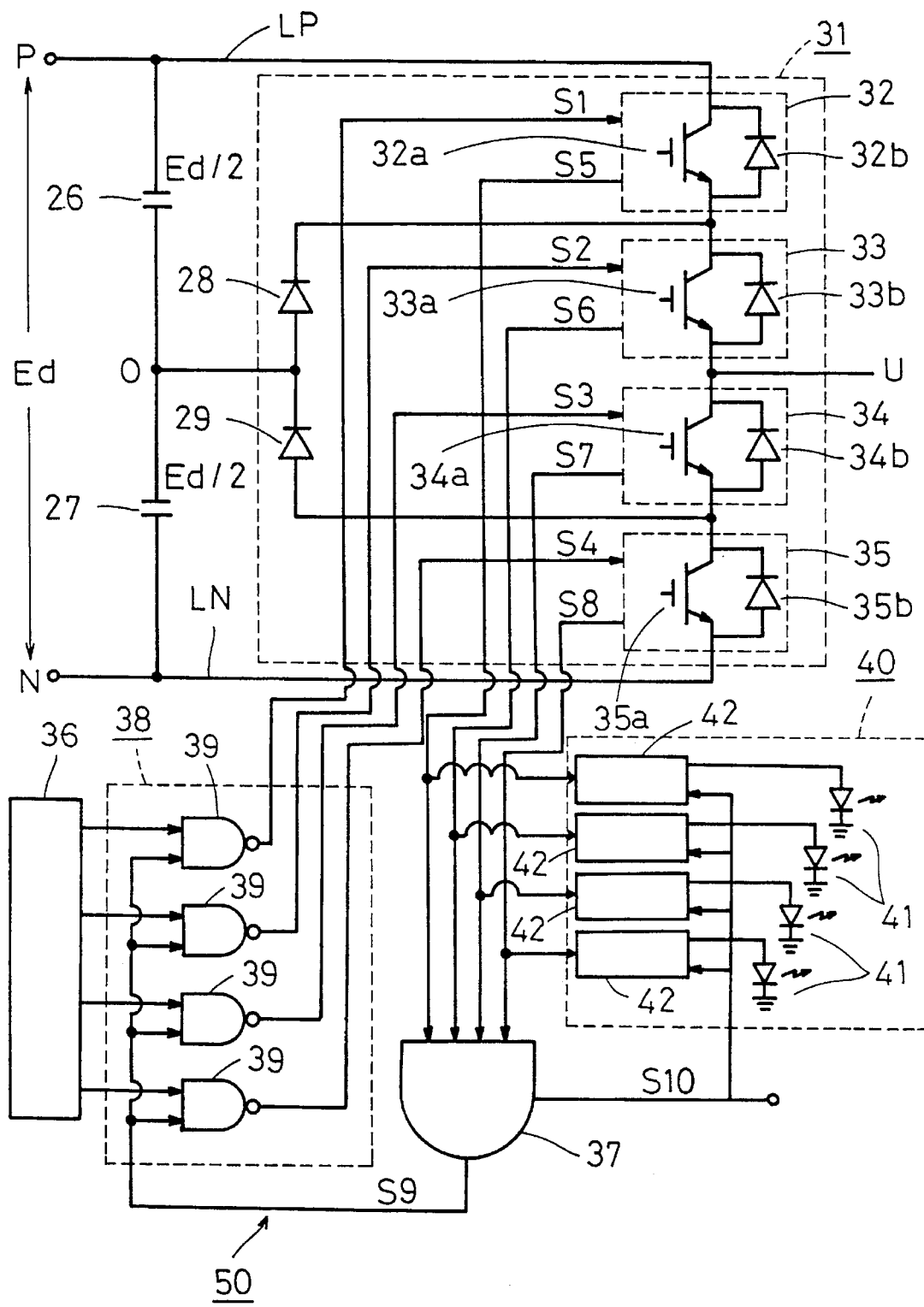
FIG. 7 is a circuit diagram of the three-level inverter of the second preferred embodiment.

FIG. 7 is a circuit diagram showing the structure of the switching circuit 31 and the control circuit 50 for one phase. In the switching circuit 31, four stages of semiconductor power modules 32–35 are connected in series between the high potential side DC bus LP and the low potential side DC bus LN. These semiconductor power modules 32–35 include IGBTs 32a–35a and free wheel diodes 32b–35b, respectively. The semiconductor power modules 32–35 are the same devices as the semiconductor power module 10 in the first preferred embodiment. That is to say, this three-level inverter is made using the semiconductor power module 100.

The connection between the two semiconductor power modules 32, 33 and the intermediate potential point O, and the connection between the two semiconductor power modules 34, 35 and the intermediate potential point O are connected through diodes 28 and 29, respectively. The diode 28 is interposed so that its forward direction is the direction from the intermediate potential point O to the semiconductor power modules 32 and 33, and the other diode 27 is interposed so that its forward direction is the direction from the semiconductor power modules 34 and 35 to the intermediate potential point O.

The control circuit 50 includes a gate control circuit 36, and individually sends input signals S1–S4 to each of the semiconductor power modules 32–35. The input signals S1–S4 correspond to the input signal Vin to each of the semiconductor power modules 32–35. That is to say, the semiconductor power modules 32–35 individually perform ON operation and OFF operation in response to the input signals S1–S4 sent by the gate control circuit 36, respectively.

An error stop circuit 38 is interposed between the gate control circuit 36 and the semiconductor power modules 32–35. The error stop circuit 38 includes AND circuits 39 for each of the input signals S1–S4. A signal S9 outputted from another AND circuit 37 is inputted to the AND circuits 39 together with the output signals from the gate control circuit 36. Error signals S5–S8 from the respective semiconductor power modules 32–35 are inputted to the AND circuit 37. The error signals S5–S8 correspond to the error signal F2 outputted by each of the semiconductor power modules 32–35. The AND circuit 39 is formed by using NAND element, and the other AND circuit 37 is formed by using AND element and latch element.

The AND circuit 37 outputs "H" as the signal S9 when error signals S5–S8 are all normal signals ("H"), and, if even one of the error signals S5–S8 changes to an active signal ("L"), it holds "L" in its output after that. When the error signals S5–S8 return to "H" and a reset signal S10 is inputted, the output of the AND circuit 37 returns to "H". The AND circuit 39 inverts the signal from the gate control circuit 36 and outputs it when the signal S9 is "H", and it outputs "H" without depending on the signal from the gate control circuit 36 when the signal S9 is "L".

The control circuit 50 also includes an error display circuit 40. This error display circuit 40 includes four latch circuits 42 to which the error signals S5–S8 are individually inputted. Outputs of these latch circuits 42 are individually connected to LEDs 41 (light emitting diode). That is to say, when the input signals S1–S4 are "H", the latch circuits 42 do not drive the LED 41, and when any of the input signals S1–S4 changes to "L", the latch circuit 42 to which the "L" is inputted continuously drives the LED 41 after that. When the input signals S1–S4 return to "H" and the reset signal S10 is inputted, the latch circuit 42 stops driving the LED 41.

<2-2. Normal Operation>

Next, the normal operation of the switching circuit 31 and the control circuit 50 will be described. When the respective semiconductor power modules 32–35 are normally operating, the error signals S5–S8 are all normal signals ("H"), so that the AND circuit 37 outputs "H". Hence, the four AND circuits 39 all invert the output signals from the gate control circuit 36 and output them as the input signals S1–S4. That is, the semiconductor power modules 32–35 perform the ON operation and the OFF operation on the basis of the signals sent from the gate control circuit 36.

The operation at the normal time is shown in FIG. 16 and FIG. 17 which depict the operation of the conventional device. FIG. 16 and FIG. 17 can be operation description diagrams of the switching circuit 31 and the control circuit 50 at the normal time by replacing the semiconductor power modules 22–25 by the semiconductor power modules 32–35 and replacing the collector voltages V22–V25 by the collector voltages VQ1–VQ4 of the IGBTs 32a–35a.

In the normal operation, as the semiconductor power modules 32–35 operate in this way, two of the semiconductor power modules 32–35 are turned off in any of the modes. Accordingly, the collector voltages VQ1–VQ4 applied to the semiconductor power modules 32–35 are always controlled to Ed/2 or below in the normal operation.

<2-3. Operation on the Occasion of Abnormality>

Figure 8:
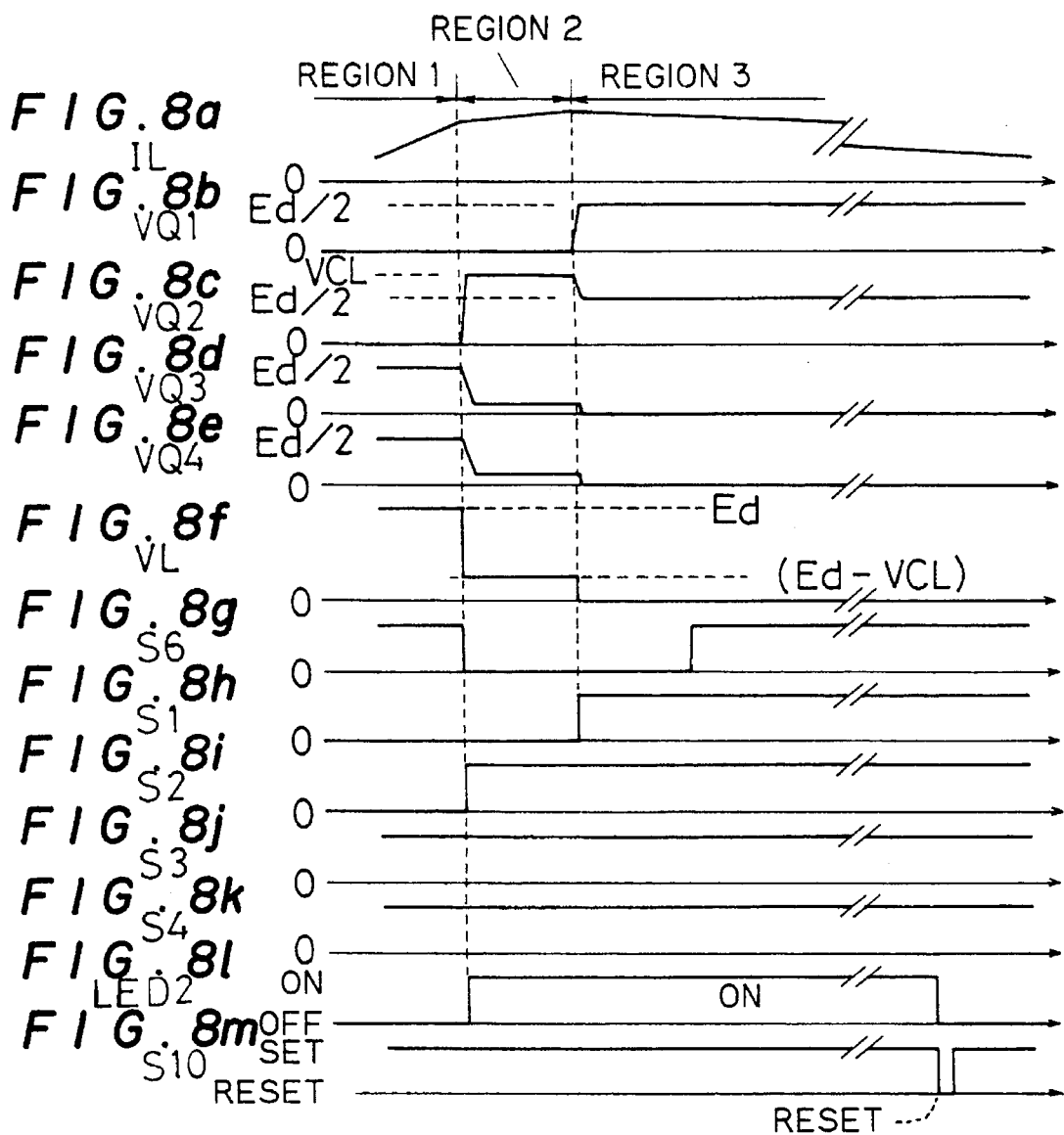
FIG. 8 is a timing chart showing operation of each part of the three-level inverter of the second preferred embodiment.
Figure 9:
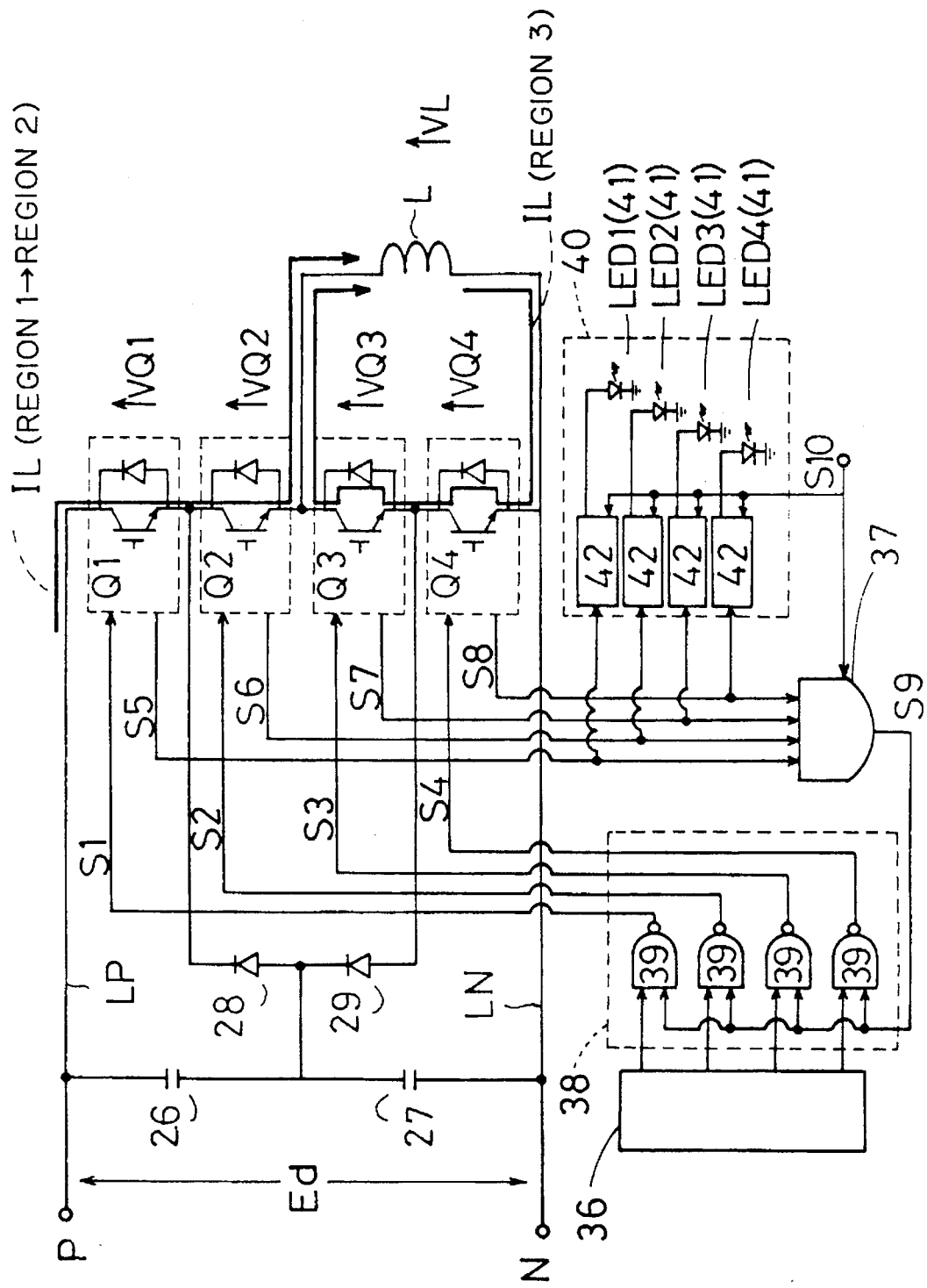
FIG. 9 is a circuit diagram for describing the operation of the three-level inverter of the second preferred embodiment.

Next, the operation in the case of abnormality which characterizes the operation of the switching circuit 31 and the control circuit 50 will be described. FIG. 8 and FIG. 9 are respectively a timing chart and a circuit diagram showing operations of the respective parts when an abnormality occurs and one of the four semiconductor power modules 32–35 changes from the original ON state to an OFF state due to an operation abnormality of the gate control circuit 36, for example.

As shown in FIG. 9, an inductive load L is connected between the output terminal U and the low potential side DC bus LN, for example. In FIG. 9, the semiconductor power modules Q1–Q4 represent the power switching semiconductor power modules 32–35 shown in FIG. 7, respectively.

Schematically shown in FIG. 8 are waveforms of the load current IL flowing in the inductive load L, the voltages VQ1–VQ4 applied to the semiconductor power modules Q1–Q4 (corresponding to the collector voltages of the IGBTs 32a–35a of the semiconductor power modules Q1–Q4), the load voltage VL applied to the inductive load L, the error signal S6, the input signals S1–S4, the forward current of the LED 2 driven by the error signal S6 and the reset signal S10.

The clamp voltage VCL in each of the semiconductor power modules Q1–Q4 is set lower than the power-supply voltage Ed between the high potential side DC bus LP and the low potential side DC bus LN, and higher than Ed/2 which is the maximum voltage applied to each of the semiconductor power modules Q1–Q4 in the normal case. That is to say, the relation Ed/2<VCL<Ed holds.

In the example of an abnormality shown in FIG. 8 and FIG. 9, the abnormality occurs when the switching circuit 31 is operating in the mode 1 (FIG. 16). Accordingly, in the normal operation period just before the occurrence of the abnormality, or in the region 1, the input signals S1 and S2 output "L", and the remaining input signals S3 and S4 output "H". In response to these input signals S1–S4, the semiconductor power modules Q1 and Q2 are ON, and the remaining semiconductor power modules Q3 and Q4 are OFF.

As a result, the semiconductor power modules Q1 and Q2 are shorted and the semiconductor power modules Q3 and Q4 equally take the power-supply voltage Ed, i.e., Ed/2 for each. Hence, as the power-supply voltage Ed is applied to the inductive load L, the load current IL increases at a rate of increase equal to Ed/L. That is to say, the rate of increase of the load current IL at this time is defined by dIL/dt=Ed/L. Note that the character L also indicates the magnitude of inductance of the inductive load L. In this normal operation, the error signals S5–S8 all maintain "H" and the LEDs 1–4 (41) are all OFF.

If an operational abnormality takes place in the gate control circuit 36, for example, and the input signal S2 changes from the original "L" to the "H", the semiconductor power module Q2 changes from the original ON state to the OFF state. At this time, an overvoltage is applied to the semiconductor power module Q2, but the semiconductor power module Q2 is clamped with the clamp voltage VCL because the clamp voltage VCL is set lower than the power-supply voltage Ed. As a result, a voltage corresponding to (Ed–VCL) is applied to the inductive load L.

In this period, that is, in the region 2, the load current IL continues to flow through the high potential side DC bus LP and the low potential side DC bus LN as in the region 1, and it also increases at the rate of increase defined by dIL/dt= (Ed–VCL)/L. That is, it increases at speed slower than in the region 1. At this time, the semiconductor power modules Q3 and Q4 equally take (Ed–VCL), respectively. That is to say, a voltage corresponding to (Ed–VCL)/2 is applied to both of the semiconductor power modules Q3 and Q4.

When the semiconductor power module Q2 is clamped with the clamp voltage VCL, that it, when the clamping circuit included in the semiconductor power module Q2 breaks over, the error signal S6 sent from the semiconductor power module Q2 changes from "H" to "L". As a result, the signal S9 outputted by the AND circuit 37 changes from "H" to "L", and it continues at "L" after that.

As the signal S9 changes to "L", the AND circuit 39 outputs "H" for all of the input signals S1–S4 irrespective of the output signal of the gate control circuit 36. As the AND circuit 37 and the AND circuit 39 have propagation delay peculiar to the circuits, respectively, a certain time delay exists from when the error signal S6 changes to "L" until when the input signals S1–S4 all go "H" at the same time. Accordingly, the region 2 continues in a certain period corresponding to the time delay.

After this certain period, all the input signals S1–S4 change to "H" and then all the semiconductor power modules Q1–Q4 move to the OFF state (region 3). As a result, as both the semiconductor power modules Q1 and Q2 connected in series to the inductive load L turn off, the load current IL can not pass through these semiconductor power modules Q1 and Q2 any more, so that it flows back to the free wheel diodes 34b and 35b built in the semiconductor power modules Q3 and Q4.

Hence, the power-supply voltage Ed is divided to the semiconductor power modules Q1 and Q2 respectively depending on the magnitude of the OFF resistance and the semiconductor power module Q2 gets out of the clamp state, and a voltage about zero is applied to the remaining semiconductor power modules Q3 and Q4. In the period of the region 3, since the load voltage VL is about zero, the load current IL decreases slowly.

In the region 3, a voltage lower than the clamp voltage VCL is generally applied to each of the semiconductor power modules Q1 and Q2. FIG. 8 especially shows an example in which the semiconductor power modules Q1 and Q2 have equal OFF resistance and they respectively take Ed/2.

Even when it moves to the region 3 and the clamp state of the semiconductor power module Q2 is cancelled, the error signal S6 maintains "L" in a finite time, though it is a short time, because of the operation of the overvoltage error signal output circuit 16. After that, an operator inputs the reset signal S10 and then the output of the AND circuit 37 returns to "H".

When it moves to the region 2, "L" is outputted for the error signal S6 and then the LED 2 is put on. The LED 2 is continuously ON thereafter by the action of the latch circuit 42 to which the error signal S6 is inputted. When the reset signal S10 is inputted the latch state of the latch circuit 42 is cancelled and the LED 2 is put off.

<2-4. Advantage of Device>

In the region 2, the load current IL which is on the increase flows to the semiconductor power module Q2 which has performed abnormal operation and a voltage corresponding to the clamp voltage VCL is applied thereto. Most of the load current IL flows in the IGBT of the semiconductor power module Q2 as has been described in the first preferred embodiment. Accordingly, in the IGBT of the semiconductor power module Q2, large loss heat corresponding to IL×VCL occurs.

This three-level inverter, however, has a circuit for turning off the semiconductor power modules Q1–Q4 at the same time in response to the error signals S5–S8 as described above, so that the period in which the clamp voltage VCL is applied to the semiconductor power module Q2 does not continue long. That is to say, the period of the region 2 in which large loss heat is caused in the semiconductor power module Q2 is terminated soon in a short time defined by the transmission delay time of the AND circuit 37 etc., and it moves to the region 3. Accordingly, overheat of and damage by burning to the IGBT resulted from the loss heat caused as the semiconductor power module Q2 is clamped are avoided.

Hence, the clamp voltage VCL can be set lower than the power-supply voltage Ed. As shown in the timing chart of FIG. 8, the semiconductor power modules Q1–Q4 are not supplied with voltage exceeding the clamp voltage VCL. Accordingly, the breakdown voltage of the semiconductor power modules Q1–Q4 forming the three-level inverter, in other words, the breakdown voltage of the IGBT included in the semiconductor power modules Q1–Q4 does not have to be set to a value with high margin from the voltage Ed/2 applied in the normal operation. Accordingly, a three-level inverter having a high rated voltage can be formed by using semiconductor power modules Q1–Q4 having certain breakdown voltage.

That is to say, the three-level inverter of this preferred embodiment can make good use of original advantages of the three-level inverter with high safety and reliability. As an example of actual values, when the rated voltage of the three-level inverter of this preferred embodiment is the same as that of the conventional device shown in FIG. 15, i.e., when it is 1500 V, it is sufficient that the IGBT of the semiconductor power modules Q1–Q4 have its breakdown voltage of 1700 V including margin.

Furthermore, in this three-level inverter, since the cut-off state of all the semiconductor power modules Q1–Q4 continues until the reset signal S10 is inputted, the inconvenience of repeating the abnormal operation caused because the operation is started again without removing a cause of the abnormality can be avoided.

Furthermore, as the error display circuit 40 is provided, an operator can recognize occurrence of the abnormality in the three-level invertor and can specify a semiconductor power module with the abnormal operation. Accordingly, the cause of the abnormality can be pursued and removed easily. The operator specifies the semiconductor power module which performed abnormal operation and then inputs the reset signal S10 to cancel the latch state of the AND circuit 37 and to put off the LED 2.

Although the error signal F2 of the first preferred embodiment, i.e., the signal sent as the clamping circuit becomes conductive has been used for each of the error signals S5–S8 in FIG. 7 and FIG. 9, the OR of the error signal F2 and the error signal F1 can be used. In this case, the AND circuit 37 and the AND circuit 39 operate not only when an overvoltage occurs but also when an overcurrent occurs, and all the semiconductor power modules Q1–Q4 turn off.

If the three-level inverter is made as mentioned above, since an overcurrent is not generated in the above-described abnormality, i.e., when the semiconductor power module Q2 turns off when it is to be ON, all the semiconductor power modules Q1–Q4 turn off only with the error signal F2. That is, operation of each part is as shown in the timing chart of FIG. 8.

<3. Third Preferred Embodiment>

Next, a two-level inverter of the third preferred embodiment will be described.

<3-1. Structure>

Figure 10:
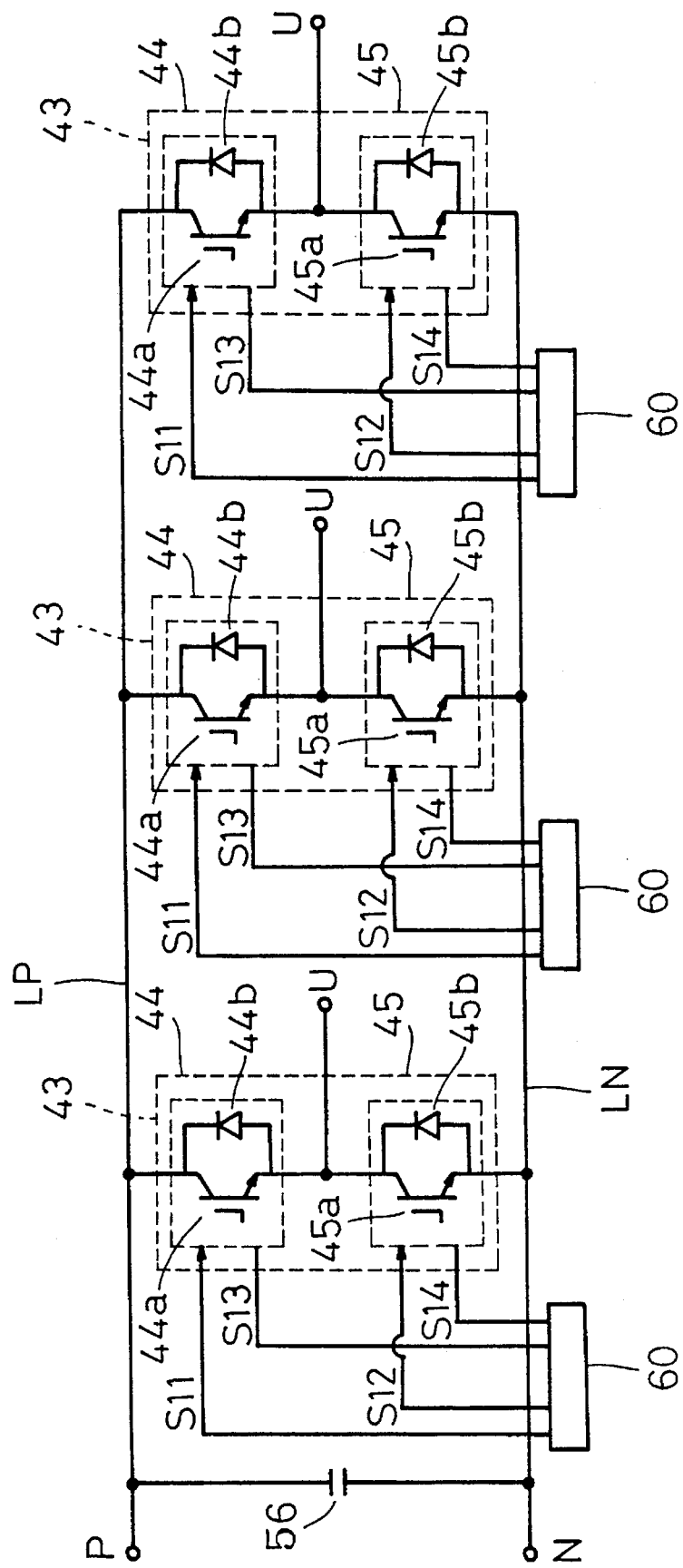
FIG. 10 is a circuit diagram of a two-level inverter of the third preferred embodiment.

FIG. 10 is a circuit diagram showing entire structure of this two-level inverter. This two-level inverter is made as a three-phase inverter. In this two-level inverter, three switching circuits 43 each corresponding to one phase are connected in parallel between a high potential side direct current bus LP connected to a high potential side power-supply terminal P and a low potential side DC bus LN connected to a low potential side power-supply terminal N. Connected to each switching circuit 43 is a control circuit 60, which controls operation of the circuit 43.

A direct current power-supply voltage Ed is applied between the high potential side power-supply terminal P and the low potential side power-supply terminal N from an external power-supply. A capacitor 56 is interposed between the high potential side DC bus LP and the low potential side DC bus LN, which ensures stability of the power-supply voltage Ed.

Figure 11:
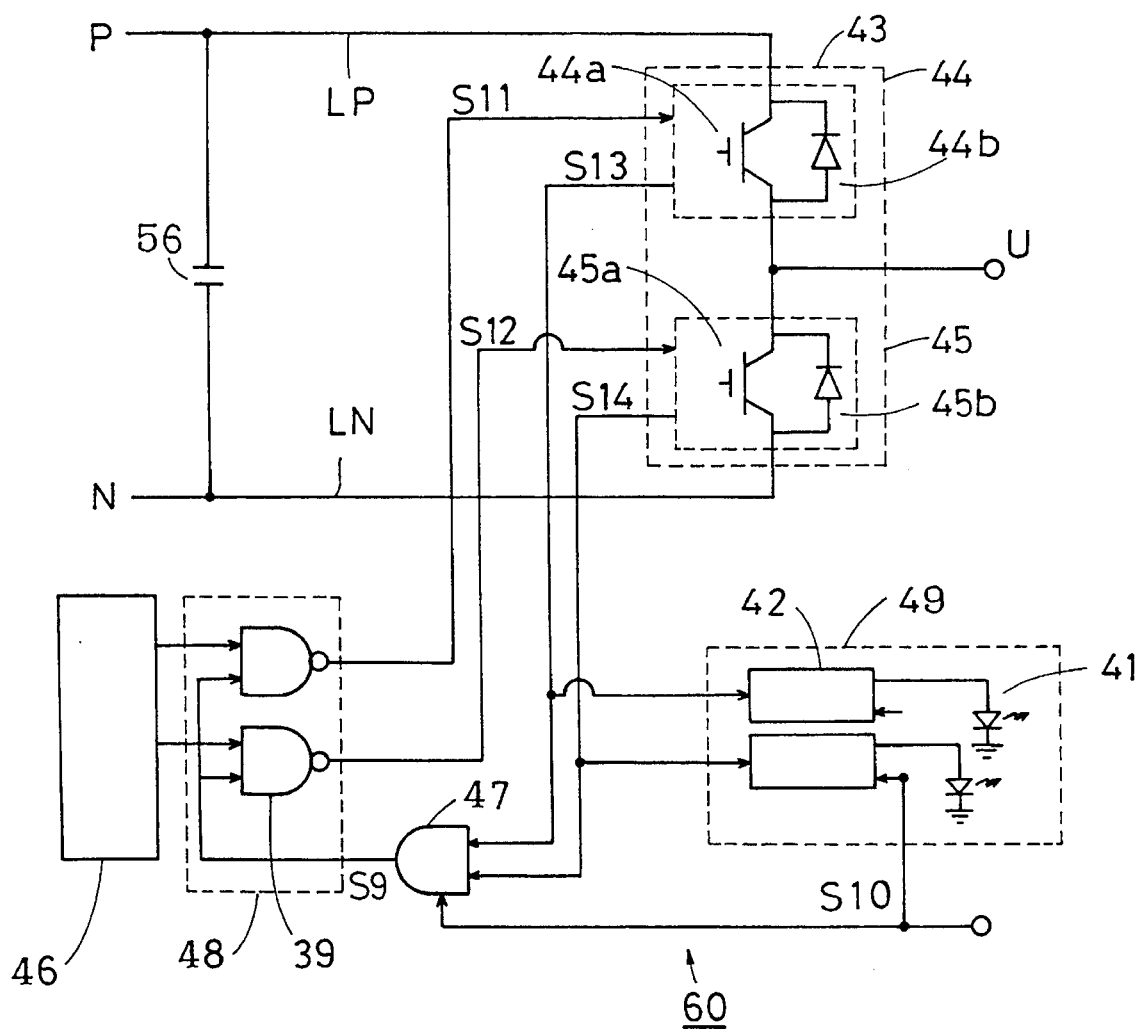
FIG. 11 is a circuit diagram of the two-level inverter of the third preferred embodiment.

FIG. 11 is a circuit diagram showing structure of the switching circuit 43 and the control circuit 60 for one phase. In the switching circuit 43, two stages of semiconductor power modules 44 and 45 are connected in series between the high potential side DC bus LP and the low potential side DC bus LN. These semiconductor power modules 44 and 45 include IGBTs 44a and 45a and free wheel diodes 44b and 45b, respectively. The semiconductor power modules 44 and 45 are the same devices as the semiconductor power module 100 of the first preferred embodiment. That is, this three-level inverter is also configured using the semiconductor power module 100 as the second preferred embodiment.

The control circuit 60 includes a gate control circuit 46, an error stop circuit 48, an AND circuit 47 and an error display circuit 49 similarly to the control circuit 50 in the second preferred embodiment. The gate control circuit 46 individually sends input signals S11, S12 to the semiconductor power modules 44, 45, respectively. The input signals S11 and S12 correspond to the input signal Vin in each semiconductor power module 44, 45. That is to say, the semiconductor power modules 44 and 45 individually perform ON operation and OFF operation in response to the input signals S11 and S12 sent by the gate control circuit 46, respectively.

The error stop circuit 48 interposed between the gate control circuit 46 and the semiconductor power modules 44 and 45 includes AND circuits 39 for each of the input signals S11 and S12. A signal S9 outputted from another AND circuit 47 is inputted to the AND circuits 39 together with the output signal from the gate control circuit 46. Inputted to the AND circuit 47 are error signals S13 and S14 from each of the semiconductor modules 44 and 45. The AND circuit 47 is formed of an AND element and a latch element.

The error signal S13 corresponds to OR of the error signal F1 and the error signal F2 outputted by the semiconductor power module 44. Accordingly, when at least one of the error signal F1 and the error signal F2 sent by the semiconductor power module 44 is an active signal ("L"), it goes "L". When both of them are normal signals ("H"), it goes "H". In other words, the error signal S13 goes "L" when the semiconductor power module 44 detects an overvoltage or an overcurrent.

Similarly, the error signal S14 corresponds to OR of the error signal F1 and the error signal F2 outputted by the semiconductor power module 45. That is to say, the error signal S14 goes "L" when the semiconductor power module 45 detects an overvoltage or an overcurrent.

The AND circuit 47 outputs "H" as the signal S9 when both of the error signals S13 and S14 are normal signals ("H"), and holds "L" in output after at least one of the error signals S13 and S14 changes to an active signal ("L"). When both the error signals S13 and S14 return to "H" and a reset signal S10 is inputted, the output of the AND circuit 47 returns to "H".

The error display circuit 49 includes two latch circuits 42 to which each error signal S13, S14 is individually inputted. Outputs of these latch circuits 42 are individually connected to two LEDs 41 (Light Emitting Diode). Similarly to the error display circuit 40 in the second preferred embodiment, a signal line transmitting the reset signal S10 is connected to the latch circuit 42.

<3-2. Normal Operation>

Next, operation of the switching circuit 43 and the control circuit 60 on the normal occasion will be described. When the semiconductor power modules 44 and 45 are performing normal operation, both the error signals S13 and S14 are normal signals ("H") and the AND circuit 47 outputs "H". Hence, the two AND circuits 39 both convert output signals from the gate control circuit 46 and output them as the input signals S11 and S12. That is to say, the semiconductor power modules 44 and 45 perform ON operation and OFF operation on the basis of the signals sent from the gate control circuit 46.

In this normal operation, the semiconductor power module 44 and the semiconductor power module 45 alternately perform ON operation and OFF operation. That is to say, two operation modes including the mode 5 in which the semiconductor power module 44 turns on and the other semiconductor power module 45 turns off and the mode 6 in which the semiconductor power module 45 turns on the other semiconductor power module 44 turns off are alternately repeated.

As a result, the potential at the output terminal U relative to the potential at the low potential side DC bus LN is equal to the power-supply voltage Ed in the mode 5, and it is equal to zero in another mode 6. Accordingly, the power-supply voltage Ed or a voltage of zero are alternately applied to each of the semiconductor power modules 44 and 45 each time the mode changes.

<3-3. Operation on the Abnormal Occasion>

Figure 12:
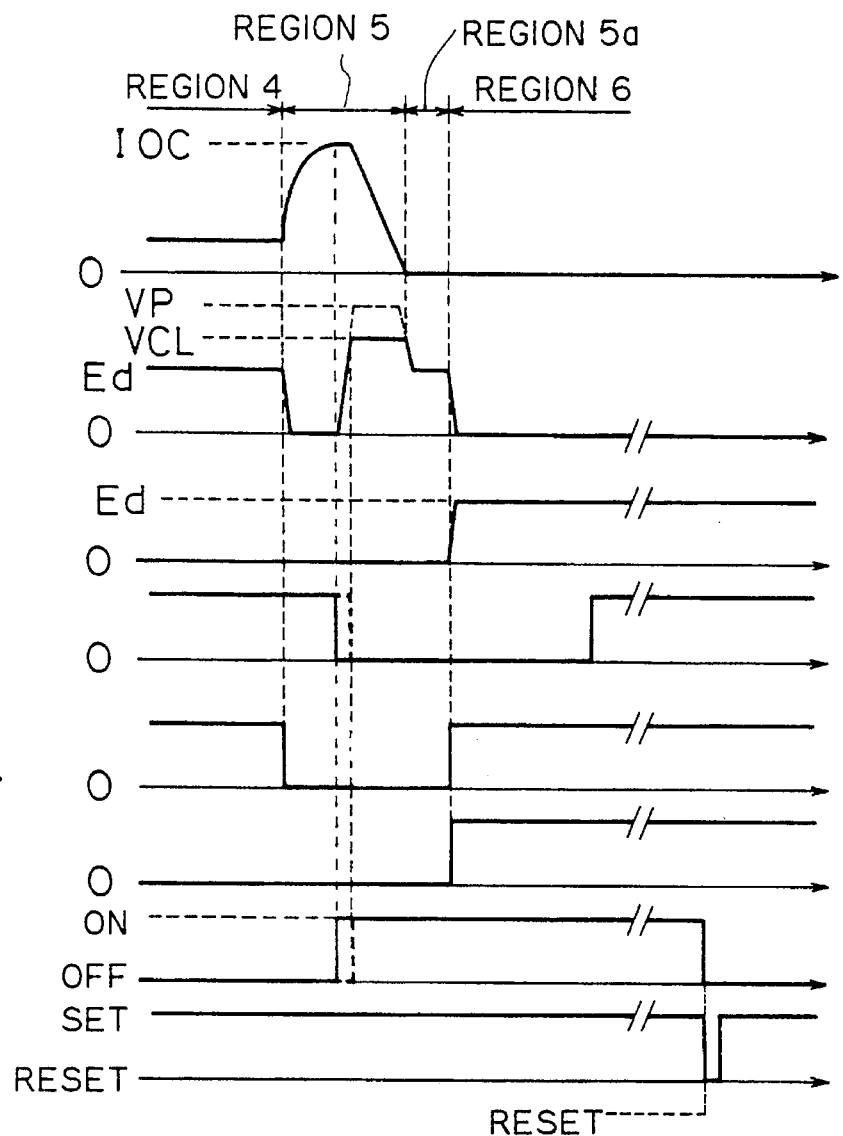
FIG. 12 is a timing chart showing the operation of each part of the two-level inverter of the third preferred embodiment.
Figure 13:
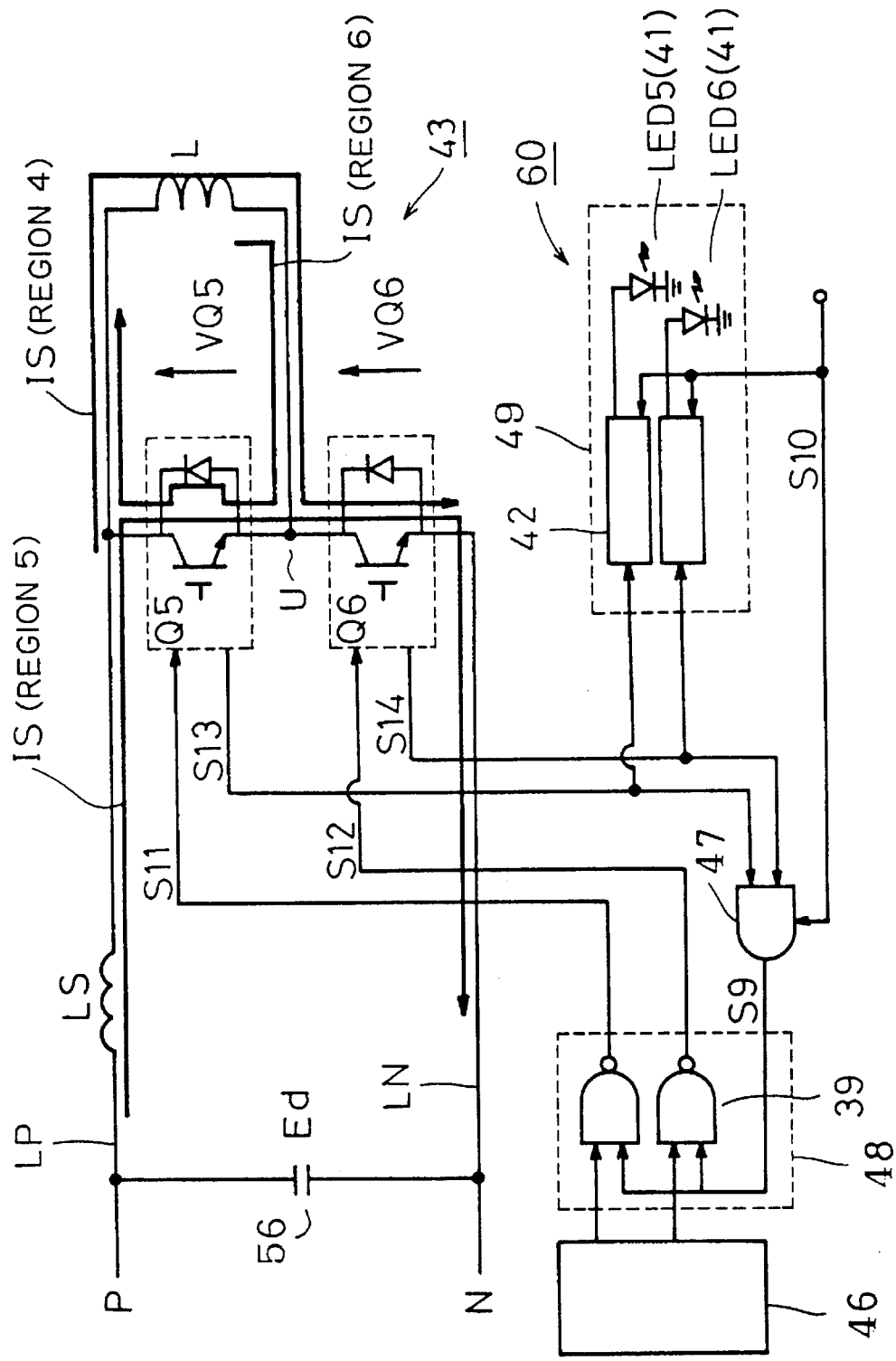
FIG. 13 is a circuit diagram for describing the operation of the two-level inverter of the third preferred embodiment.

Next, operation in the case of an abnormality which characterizes operation of the switching circuit 43 and the control circuit 60 will be described. FIG. 12 and FIG. 13 are respectively a timing chart and a circuit diagram showing operation of each part when an abnormality occurs and one of the two semiconductor power modules 44 and 45 changes from the original OFF state to the ON state due to an operation abnormality of the gate control circuit 46, for example.

As shown in FIG. 13, an inductive load L is connected between the output terminal U and the high potential side DC bus LP, for example. In FIG. 13, the semiconductor power modules Q5 and Q6 represent the power switching semiconductor power modules 44 and 45 shown in FIG. 11, respectively.

In FIG. 12, waveforms are schematically shown about the input current IS flowing in the high potential side DC bus LP having parasitic inductive component LS, voltages VQ5 and VQ6 applied to the semiconductor power modules Q5 and Q6 (corresponding to the collector voltages of the IGBTs 44a and 45a of the semiconductor power modules Q5 and Q6), the error signal S13, the input signals S11 and S12, the forward current of the LED 1 driven by the error signal S13, and the reset signal S10.

The clamp voltage VCL in each semiconductor power module Q5, Q6 is set higher than the power-supply voltage Ed and lower than the breakdown voltage of each semiconductor power module Q5, Q6.

In the example of the abnormality shown in FIG. 12 and FIG. 13, the abnormality occurs when the switching circuit 43 is performing operation in the mode 6. Accordingly, in the normal operation period immediately before the abnormality occurs, i.e., in the region 4, the input signal S11 outputs "H" and the other input signal S12 outputs "L". In response to these input signals S11 and S12, the semiconductor power module Q5 is OFF and the other semiconductor power module Q6 is ON.

As a result, the semiconductor power module Q6 is shorted and the semiconductor power module Q5 takes the power-supply voltage Ed. Hence, the power-supply voltage Ed is applied to the inductive load L, and the input current IS from the high potential side DC bus LP is supplied to "L". The rate of increase of the input current IS at this time is defined by the inductive load L. At this normal operation time, both the error signals S13 and S14 maintain "H", and both the LEDs 5 and 6 (41) are OFF.

If an operational abnormality occurs in the gate control circuit 46, for example, and the input signal S11 changes from the original "H" to "L", the semiconductor power module Q5 changes from original OFF to ON. As a result, both the semiconductor power modules Q5 and Q6 turn on, and then the switching circuit 43 for one phase interposed between the high potential side DC bus LP and the low potential side DC bus LN gets in the short-circuit state. (so-called "arm short")

Hence, the input current IS flows as the short-circuit current between the high potential side DC bus LP and the low potential side DC bus LN. Accordingly, the input current IS rapidly increases. The rate of increase of the input current IS at this time is defined mainly by the inductive component LS. Since the inductive component LS is much smaller than inductance of the inductive load L, the rate of increase of the input current IS in the region 5 which is after the occurrence of abnormality is much larger than the rate of increase in the region 4.

When the input current flowing under the short-circuit exceeds the overcurrent detection level IOC (a magnitude of a collector current at which the sink transistor 10 and the like start operating) which is set in the semiconductor power module QS, the semiconductor power module Q5 brings the error signal F1 to active ("L"), and the RTC circuit 12 and the sink transistor 10 (FIG. 3) operate to self cut off. At this time, the energy accumulated in the inductive component LS by the excessive short-circuit current tries to apply a surge voltage to the semiconductor power module QS.

However, the voltage VQ5 applied to the semiconductor power module Q5 is limited to the clamp voltage VCL by the action of the clamping circuit 110 (FIG. 4) included in the semiconductor power module QS. The condition where the voltage VQ5 is clamped to the clamping voltage VCL continues over the period in which the energy of the inductive component LS is consumed by the semiconductor power module Q5 (region 5).

When the input current IS attenuates to zero, the semiconductor power module Q5 gets out of the clamp state, and a voltage corresponding to the power-supply voltage Ed is applied to the semiconductor power module Q5 in the OFF state by the action of the sink transistor 10 (region 5a).

As described above, when the input current IS exceeds the overcurrent detection level IOC, the error signal F1 of the semiconductor power module Q5 changes from normal ("H") to active ("L"). As a result, the error signal S13 changes from "H" to "L", and then the signal S9 outputted by the AND circuit 47 changes from "H" to "L", and further, it continues "L" after that.

As a result of the signal S9 changing to "L", the AND circuit 39 outputs "H" for all the input signals S11 and S12 irrespective of the output signal of the gate control circuit 46. Because the AND circuit 47 and the AND circuits 39 have transmission delays peculiar to the circuits, respectively, a certain time delay exists from when the error signal S13 changes to "L" until when the input signals S11 and S12 attain "H". Accordingly, the region 5a continues over a certain period.

After this period, all the input signals S11 and S12 change to "H", and then all the semiconductor power modules Q5 and Q6 move to the OFF state (region 6). As the semiconductor power module Q5 is already in the OFF state in the region 5a by the action of the sink transistor 10 and the like, the semiconductor power module Q6 newly turns off when it moves from the region 5a to the region 6.

That is to say, as the semiconductor power module Q6 connected to the inductive load L in series turns off, the load current IL can not pass through the semiconductor power module Q6 any longer, so that it flows back to the free wheel diode 44b included in the semiconductor power module Q5. Accordingly, the power-supply voltage Ed is applied to the semiconductor power module Q6, and a voltage of about zero is applied to the other semiconductor power module Q5.

Even when it moves from the region 5 to the region 5a and the clamp state of the semiconductor power module Q5 is cancelled, the error signal S13 maintains "L" over a finite time by the action of the overvoltage error signal output circuit 16 (FIG. 4), through it is a short time. After that, an operator inputs the reset signal S10 and then the output of the AND circuit 47 returns to "H".

When moving to the region 5, "L" is outputted for the error signal S13, and the LED 2 is put on. The LED 2 is continuously ON after that by the action of the latch circuit 42 to which the error signal S13 is inputted. When the reset signal is inputted, the latch state of the latch circuit 42 is cancelled and the LED 2 is put off.

<3-4. Advantage of Device>

If the semiconductor power module does not include the clamping circuit 110, the voltage VQ5 increases to the high voltage level VP exceeding the breakdown voltage of the semiconductor power module Q5 in the region 5 as shown by the dotted line in the waveform of the voltage VQ5 in FIG. 12. As a result, the semiconductor power module Q5 may result in breakdown. However, in the two-level inverter of this preferred embodiment, since the semiconductor power modules Q5 and Q6 include the clamping circuit 110 (FIG. 4) and the clamp voltage VCL is set lower than the breakdown voltage of the semiconductor power modules Q5 and Q6, breakdown of the semiconductor power module Q5 by the application of an overvoltage in the region 5 is avoided.

Also, the semiconductor power module Q5 (100) includes the overvoltage detection circuit 11 as shown in FIG. 4, so that the operation of the sink transistor 10 for cutting off the overcurrent is cancelled when the clamping circuit 110 becomes conductive. Accordingly, in the region 5, when the voltage VQ5 applied to the semiconductor power module Q5 is clamped to the clamp voltage VCL, there is no possibility of overheat of and damage by burning to the clamping circuit 110 caused by the excessive input current IS. That is to say, the two-level inverter of this preferred embodiment is stably protected from the surge voltage caused by cutting off abnormal excessive current such as a short-circuit current.

From the facts described above, the margin of the breakdown voltage of the semiconductor power module can be reduced with respect to the power-supply voltage Ed. In other words, a two-level inverter having a high rated voltage can be formed using semiconductor power modules having a certain breakdown voltage.

Furthermore, by providing the error display circuit 49, an operator can recognize occurrence of an abnormality in the two-level inverter and also can specify a semiconductor power module of the abnormal operation. This facilitates pursuit and removal of a cause of the abnormality. The operator specifies the semiconductor power module which performed the abnormal operation, and then inputs the reset signal S10 to cancel the latch state of the AND circuit 47 and put off the LED 2.

Although the OR of the error signal F1 and the error signal F2 in each of the semiconductor power modules Q5 and Q6 is applied for the error signals S13 and S14 in FIG. 11 and FIG. 13, only the error signal F2 may be applied as in the three-level inverter in the second preferred embodiment. In this case, when an overvoltage occurs, the AND circuit 47 and the AND circuit 39 operate and all the semiconductor power modules Q5 and Q6 turn off.

When the two-level inverter is made in this way, the point at which the error signal S13 changes from "H" to "L" is shifted to the time when the voltage VQ5 is clamped to the clamp voltage VCL which is a little delayed from the time when the input current IS exceeds the overcurrent detection level IOC. (In FIG. 12, shown by the dotted line portion in the waveform of the error signal S13 and the waveform of the forward current of the LED 1.) However, the time difference between them is very small and has no effective difference in protecting the semiconductor power module Q5.

The abnormal operation has been shown as an example in the second preferred embodiment where a semiconductor power module which is originally to be ON turns off in the three-level inverter, and an abnormal operation has been shown as an example in this third preferred embodiment where a semiconductor power module which is originally to be OFF turns on in the two-level inverter. In the three-level inverter, however, if an abnormality occurs in which a semiconductor power module which is originally to be OFF turns on, the semiconductor power module to which an overvoltage is applied is safely clamped as can be easily understood from the example in the third preferred embodiment, and large margin is not required for the breakdown voltage of the semiconductor power module as described in the second preferred embodiment.

Similarly, in the two-level inverter, even if an abnormality occurs and a semiconductor power module which is originally to be ON turns off, the semiconductor power module to which an overvoltage is applied is safely clamped as can be easily understood from the example shown in the second preferred embodiment and large margin is not required for the breakdown voltage of the semiconductor power module as discussed in the third preferred embodiment.

<4. Other Preferred Embodiments>

(1) in the preferred embodiments above, the three-level inverter and the two-level inverter have been shown as power conversion devices. However, application of the semiconductor power modules and circuits corresponding to the control circuits 50 and 60 to other power conversion devices can produce the same effects as those in the above-described preferred embodiments. For example, application to devices having inverter and converter coupled, such as the three-level converter•inverter device and the two-level inverter•converter device, can produce the same effects.

(2) In the preferred embodiments described above, the IGBT has been shown as a switching semiconductor element built in the semiconductor power module, but other switching semiconductor elements than the IGBT can be used. For example, a MOS transistor for power, or a bipolar transistor for power may be used.

(3) In the preferred embodiments describe above, the LED has been used for the error display circuits 40 and 49, but other display elements or display devices may be used. Although the examples using AND element and latch element for the AND circuits 37 and 47 and using the NAND element for the AND circuit 39 have been shown, other elements or devices with the same functions may be used.

While the invention has been described in detail, the foregoing description is in all aspects illustrative and not restrictive. It is understood that numerous other modifications and variations can be devised without departing from the scope of the invention.

What is claimed is:

1. A semiconductor power module, comprising:
   (a) a switching semiconductor element having first and second main electrodes which are a pair of main electrodes, and a control electrode, for controlling a main current flowing between the pair of main electrodes in response to a control signal applied to the control electrode, and
   wherein said first main electrode of said switching semiconductor element has a large electrode through which main part of said main current flows and a small electrode through which a small current in proportion to said main current flows;
   (b) control means responsive to an input signal for outputting said control signal;
   (c) overcurrent protection means for realizing a conducting state between said first main electrode and said control electrode when said main current exceeds a predetermined reference value to cut off said main current between said pair of main electrodes, and said overcurrent protection means further comprises,
   switch means having its one end connected to said control electrode and the other end connected to said large electrode and which becomes conductive in response to an overcurrent detection signal;
   (d) clamp means connected between said second main electrode and said control electrode and which becomes conductive when a voltage exceeding a predetermined reference voltage is applied; and
   (e) cancelling means for cancelling operation of said overcurrent protection means when said clamp means becomes conductive and for cancelling conduction of said switch means which becomes conductive in response to said overcurrent detection signal, when said clamp means becomes conductive.

2. The semiconductor power module according to claim 1, wherein said clamp means comprises,
   (d-1) a constant-voltage element defining said predetermined reference voltage.

3. The semiconductor power module according to claim 2, wherein said constant-voltage element comprises, (d-1-1) a Zener diode.

4. The semiconductor power module according to claim 3, wherein said clamp means further comprises, (d-2) a diode interposed between said Zener diode and said control electrode in a direction which is a forward direction with respect to a clamp current flowing when said clamp means becomes conductive.

5. The semiconductor power module according to claim 4, wherein said clamp means further comprises, (d-3) a clamp current limiting resistance element connected in series to said diode.

6. The semiconductor power module according to claim 5, further comprising:

(f) a free wheel diode having its one end connected to said first main electrode and the other end connected to said second main electrode in a direction which is inverse-parallel connection with respect to said switching semiconductor element.

7. The semiconductor power module according to claim 1, wherein said overcurrent protection means comprises, (c-1) a sensing resistance having its one end connected to said small main electrode, (c-2) with said control means taken as first control means, second control means for detecting a sensing voltage generated in said sensing resistance and outputting said overcurrent detection signal when the sensing voltage exceeds a predetermined reference voltage value.

8. The semiconductor power module according to claim 1, wherein said switch means comprises, (c-3) an overcurrent blocking transistor having a collector electrode, an emitter electrode and a base electrode, said collector electrode being connected to said control electrode, said emitter electrode being connected to said large main electrode, and said base electrode being connected to said second control means, where said overcurrent detection signal is inputted to the base electrode and then it becomes conductive between said collector electrode and said emitter electrode, and said cancelling means comprises, (e-1) clamp conduction detection means for making a detection as to whether said clamp means is conducting or not, and (e-2) with said switch means taken as first switch means, second switch means which has its one end connected to said base electrode and the other end connected to said emitter electrode, and becomes conductive when said clamp conduction detection means detects conduction.

9. The semiconductor power module according to claim 8, wherein said clamp means comprises, (d-1) a Zener diode having its one end connected to said second main electrode in an opposite direction to a clamp current flowing in the clamp means when said clamp means becomes conductive, and (d-2) a series circuit having a diode in a forward direction with respect to said clamp current and a resistance element connected in series, and having its one end connected to the other end of said Zener diode and the other end connected to said control electrode, said second switch means comprises, (e-2-1) with said base electrode, said collector electrode and said emitter electrode taken as a first base electrode, a first collector electrode and a first emitter electrode, respectively, a cancelling transistor having a second base electrode, a second collector electrode connected to said first base electrode and a second emitter electrode connected to said first emitter electrode, and said clamp conduction detection means comprises, (e-1-1) a clamp current detection circuit having its first end connected to said other end of said Zener diode, its second end connected to said second emitter electrode and its third end connected to said second base electrode for outputting a signal corresponding to a detection current flowing between said first end and said second end from said third end to said second base electrode so that a current having a magnitude in proportion to the detection current flows to said cancelling transistor.

10. The semiconductor power module according to claim 9, wherein said clamp current detection circuit comprises, (e-2-1) with said resistance element taken as a first resistance element, a second resistance element having its one end coupled to said Zener diode, and (e-2-2) a clamp current detecting transistor having a third collector electrode connected to the other end of said second resistance element, a third base electrode connected to both said second base electrode and said third collector and a third emitter electrode connected to said second emitter electrode.

11. The semiconductor power module according to claim 7, wherein with said overcurrent detection signal taken as a first overcurrent detection signal, said second control means further outputs a second overcurrent detection signal prior to said first overcurrent detection signal when said sensing voltage exceeds a predetermined reference voltage value, and said overcurrent protection means further comprises, (c-4) overcurrent limiting means, having its one end connected to said control electrode and the other end connected to said large main electrode, for limiting in response to said second overcurrent detection signal a magnitude of said main current to a predetermined finite value.

12. The semiconductor power module according to claim 11, wherein said overcurrent limiting means comprises, (c-4-1) an overcurrent limiting resistance element having its one end connected to said control electrode, and (c-4-2) an overcurrent limiting transistor having a collector electrode connected to the other end of said overcurrent limiting resistance, an emitter electrode connected to said large main electrode and a base electrode connected to said second control means, and said base electrode supplied with said second current detection signal so that said collector electrode and said emitter electrode become conductive therebetween.

13. The semiconductor power module according to claim 1, wherein said switching semiconductor element comprises, (a-1) an insulated gate type bipolar transistor having an emitter electrode functioning as said large main electrode, a sensing electrode functioning as said small main electrode, a collector electrode functioning as said second electrode and a gate electrode functioning as said control electrode.

14. The semiconductor power module according to claim 1, further comprising;

(f) a diode having its one end connected to said first main electrode and the other end coupled to said control electrode, wherein said diode is provided in a direction to prevent part of a clamp current flowing in said clamp means when said clamp means becomes conductive from flowing in the diode.

15. The semiconductor power module according to claim 14, wherein said clamp means comprises,
- (d-1) a Zener diode having its one end connected to said second main electrode in an opposite direction to the clamp current flowing in the clamp means when said clamp means becomes conductive, and
- (d-2) with said diode taken as a first diode, a series circuit having a second diode in a forward direction with respect to said clamp current and a resistance element connected in series, and having its one end connected to the other end of said Zener diode and the other end connected to said control electrode, and said first diode has its one end connected to said first main electrode and the other end connected to said other end of said Zener diode.

16. The semiconductor power module according to claim 1, wherein said cancelling means cancels operation of said overcurrent protection means when said clamp means becomes conductive and outputs an error signal.

17. The semiconductor power module according to claim 1, wherein said cancelling means and said clamp means are coupled so that a current flowing in the clamp means when said clamp means becomes conductive is divided to said cancelling means,
- said cancelling means operating when the divided current component exceeds a predetermined reference value, and
- said semiconductor power module further comprises,
  - (g) a resistance interposed between a connecting node, said connecting node connecting said clamp means, said cancelling means and said first main electrode.

18. The semiconductor power module according to claim 1, wherein said switching semiconductor element includes an even number of unit switching elements and the unit switching elements are provided symmetrically with said clamp means interposed therebetween.

19. A power conversion device, comprising:
- (a) switching means interposed between a high potential side direct current bus and a low potential side direct current bus, wherein the switching means comprises,
  - (a-1) a plurality of semiconductor power modules connected in series, each of said plurality of semiconductor power modules comprising,
    - (a-1-1) a switching semiconductor element having first and second main electrodes which are a pair of main electrodes, and a control electrode, for controlling a main current flowing between the pair of main electrodes in response to a control signal applied to the control electrode, and wherein said first main electrode of said switching semiconductor element has a large electrode through which main part of said main current flows and a small electrode through which a small current in proportion to said main current flows;

- (a-1-2) control means responsive to an input signal for outputting said control signal,
- (a-1-3) overcurrent protection means for realizing a conducting state between said first main electrode and said control electrode when said main current exceeds a predetermine reference value to cut off said main current between said pair of main electrodes, and said overcurrent protection means further comprises, switch means having its one end connected to said control electrode and the other end connected to said large electrode and which becomes conductive in response to an overcurrent detection signal;

- (a-1-4) clamp means having its one end connected to said second main electrode and the other end connected to said control electrode and which becomes conductive when a voltage exceeding a predetermined reference voltage is applied, and
- (a-1-5) cancelling means for cancelling operation of said overcurrent protection means by cancelling conduction of said switch means which becomes conductive in response to said overcurrent detection signal, when said clamp means becomes conductive and for outputting a predetermined error signal, and said power conversion device further comprises,
- (b) gate control means for sending said input signal to each of said plurality of semiconductor power modules, and
- (c) cutting off means for cutting off all of said plurality of semiconductor power modules when at least one of said plurality of semiconductor power modules sends said predetermined error signal.

20. The power conversion device according to claim 19, wherein said overcurrent protection means comprises,
- (a-1-3-1) with said error signal taken as a first error signal, error signal sending means for outputting a predetermined second error signal when said main current exceeds said predetermined reference value, and said cutting off means comprises,
- (c-1) means for cutting off all of said plurality of semiconductor power modules when at least one of said plurality of semiconductor power modules sends either said predetermined first error signal or second error signal.

21. The power conversion device according to claim 19, wherein after said cutting off means starts operating, the cutting off means continues operating until a reset signal is applied.

22. The power conversion device according to claim 19, further comprising,
- (d) error display means for, when at least one of said plurality of semiconductor power modules sends said error signal, continuously indicating that an error has occurred and which semiconductor power module sent said error signal in a period from when said error signal was sent until when a reset signal is applied.

* * * * *